(12) United States Patent
Tsunashima et al.

(10) Patent No.: US 6,376,888 B1
(45) Date of Patent: Apr. 23, 2002

(54) SEMICONDUCTOR DEVICE AND METHOD OF MANUFACTURING THE SAME

(75) Inventors: Yoshitaka Tsunashima; Kyoichi Suguro, both of Yokohama; Atsushi Murakoshi, Kawasaki; Kouji Matsuo; Toshihiko Iinuma, both of Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/559,356

(22) Filed: Apr. 27, 2000

(30) Foreign Application Priority Data

Apr. 30, 1999 (JP) .............................. 11-124405

(51) Int. Cl.⁷ .................. H01L 29/76; H01L 29/94; H01L 31/062; H01L 31/113; H01L 31/119
(52) U.S. Cl. ........................ 257/407; 257/761
(58) Field of Search ................ 257/288, 310, 257/401, 407, 412, 413, 510, 377, 742, 761, 763

(56) References Cited

U.S. PATENT DOCUMENTS

| | | | |
|---|---|---|---|
| 4,743,953 A | * 5/1988 | Toyokura et al. | 357/23.6 |
| 5,668,024 A | * 9/1997 | Tsai et al. | 438/199 |
| 5,940,699 A | * 8/1999 | Sumi et al. | 438/233 |
| 6,140,688 A | * 10/2000 | Gardner et al. | 257/412 |
| 6,184,083 B1 | 2/2001 | Tsunashima et al. | |
| 6,278,164 B1 | 8/2001 | Hieda et al. | |

FOREIGN PATENT DOCUMENTS

| | | |
|---|---|---|
| JP | 10-189966 | 7/1998 |
| JP | 11-74369 | 3/1999 |
| JP | 11-243150 | 9/1999 |

* cited by examiner

Primary Examiner—David Nelms
Assistant Examiner—David Nhu
(74) Attorney, Agent, or Firm—Finnegan, Henderson, Farabow, Garrett, & Dunner. L.L.P.

(57) ABSTRACT

Disclosed is a semiconductor device having an N-type MIS transistor formed in a first region and a P-type MIS transistor formed in a second region, wherein, the N-type MIS transistor includes a first gate insulating film formed on at least the bottom of a first concave portion formed in the first region and a first gate electrode formed on the first gate insulating film, the P-type MIS transistor includes a second gate insulating film formed on at least the bottom of a second concave portion formed in the second region and a second gate electrode formed on the second gate insulating film, each of the first and second gate electrodes includes at least one metal-containing film, and at least one of the first and second gate electrodes is of a laminate structure including a plurality of the metal-containing films, and the work function of the metal-containing film constituting at least a part of the first gate electrode and in contact with the first gate insulating film is smaller than the work function of the metal-containing film constituting at least a part of the second gate electrode and in contact with the second gate insulating film.

8 Claims, 20 Drawing Sheets

N-TYPE MISFET     P-TYPE MISFET

N-TYPE MISFET   P-TYPE MISFET

N-TYPE MISFET     P-TYPE MISFET

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 11-124405, filed Apr. 30, 1999, the entire contents of which are incorporated herein by reference.

BACKGROUND OF THE INVENTION

1. Field of the Invention

The present invention relates to a semiconductor device and a method of manufacturing the same, particularly, to an improvement of a gate electrode for an N-type MIS transistor and a P-type MIS transistor.

2. Description of the Related Art

For improving the performance of the MIS transistor, it is absolutely necessary to make the device finer. However, a silicon oxide film used nowadays as a gate insulating film is low in its dielectric constant, giving rise to the problem that it is impossible to increase the capacitance of the gate insulating film. Also, a polycrystalline silicon (polysilicon) used as a gate electrode has a high resistivity, resulting in failure to lower the resistance. To overcome these problems, it is proposed to use a film having a high dielectric constant for forming the gate insulating film to use a metallic material for forming the gate electrode.

However, these materials are poor in heat resistance, compared with the materials used nowadays. Under the circumstances, proposed is a damascene gate technology that permits forming a gate insulating film and a gate electrode after a high temperature process.

In the damascene gate technology, a dummy gate is formed in advance in a region where a gate is to be formed later. The dummy gate is removed after formation of the source-drain diffusion layers, and an electrode material is buried in the region from which the dummy gate has been removed so as to form a gate electrode.

If the same material is used for forming the gate electrodes of the N-type and P-type MIS transistors in the case of forming the gate electrode by employing the damascene gate technology, it is impossible to make the gate electrodes of these transistors differ from each in the work function. As a result, it is impossible to make appropriate the threshold voltage of each of the N-type and P-type MIS transistors. Therefore, a manufacturing process using different gate electrode materials is required for manufacturing an N-type MIS transistor and a P-type MIS transistor. FIGS. 15A to 15I collectively exemplify such a manufacturing process.

In the first step, an element isolating region 502 of an STI structure is formed on a silicon substrate 501, as shown in FIG. 15A. Then, a silicon oxide film 503 is formed in a thickness of about 6 nm as a dummy insulating film that is to be removed later. Further, a laminate structure consisting of a polysilicon film 504 having a thickness of about 150 nm and a silicon nitride film 505 having a thickness of about 50 nm is formed as a dummy gate that is to be removed later. These dummy insulating film and dummy gate are formed by the ordinary technology such as a film-forming technology including an oxidation, CVD and the like, lithography technology, and RIE technology. After formation of the dummy gate, impurity ions are implanted by using the dummy gate (the polysilicon film 504 and the silicon nitride film 505) as a mask to form a diffusion layer for extension for forming source-drain diffusion layers 506. Then, a gate side wall insulating film consisting of a silicon nitride film 507 having a width of about 40 nm is formed by the CVD technology and the RIE technology, as shown in FIG. 15A.

In the next step, impurity ions are implanted by using the dummy gate (the polysilicon film 504 and the silicon nitride film 505) and the gate side wall insulating film (silicon nitride film 507) as a mask to form impurity diffusion layers having a high impurity concentration, said impurity diffusion layers constituting source-drain diffusion layers 508. Then, a silicide film 509 having a thickness of about 40 nm (cobalt silicide film or a titanium silicide film) is formed in only the source-drain regions by the salicide process technology, as shown in FIG. 15B.

In the next step, an interlayer insulating film 510 is formed, for example, a silicon oxide film by a CVD method. Then, the interlayer insulating film 510 is flattened by a CMP technology so as to expose the surfaces of the silicon nitride films 505 and 507, as shown in FIG. 15C.

Further, the silicon nitride film 505 in an upper portion of the dummy gate is selectively removed by using a phosphoric acid relative to the interlayer insulating film 510. In this step, the silicon nitride film 507 is also etched to the height of the polysilicon film 504. Then, the polysilicon film 504 is selectively removed by the etching technology using radicals of halogen atoms such as fluorine atoms, as shown in FIG. 15D.

In the next step, a groove is formed by removing the dummy silicon oxide film 503 by a wet etching using, for example, hydrofluoric acid, followed by forming a $Ta_2O_5$ film 512, which is a high dielectric constant film, as a gate insulating film by, for example, a CVD method. Further, an aluminum film 513, is deposited to form a gate electrode, as shown in FIG. 15E. After formation of the aluminum film 513, the $Ta_2O_5$ film 512 and the aluminum film 513 are flattened until the interlayer insulating film 510 is exposed to the surface, as shown in FIG. 15F.

The steps shown in FIGS. 15A to 15F are applied to both the N-type MIS transistor forming region and the P-type MIS transistor forming region, though only one region is shown in the drawings. In the subsequent steps, however, both the N-type MIS transistor (N-type MISFET) forming region and the P-type MIS transistor (P-type MISFET) forming regions are shown in the drawings.

After the step shown in FIG. 15F, the entire surface except the P-type MIS transistor forming region is covered with a resist layer 514 by using a lithography technology, as shown in FIG. 15G. Then, the aluminum film 513 in only the P-type region is removed by the wet etching using a phosphoric acid. In this step, the silicon nitride film 507, which is exposed to the surface, is scarcely etched with phosphoric acid under room temperature, as shown in FIG. 15H.

In the next step, the resist layer 514 is removed and a metal having a work function of about 5 eV, e.g., a cobalt film 515, is deposited on the entire surface, as shown in FIG. 15I. Finally, the cobalt film 515 is flattened by a CMP technology until the interlayer insulating film 510 is exposed to the surface, as shown in FIG. 15J.

In the semiconductor device manufactured by the process described above, the aluminum film 513 forms the gate electrode of the N-type MIS transistor, and the cobalt film 515 forms the gate electrode of the P-type MIS transistor so as to provide a C-MIS transistor. It should be noted that the aluminum film 513 has a work function of about 4.2 eV and the cobalt film 515 has a work function of about 5 eV. It follows that it is possible to make appropriate the work function of the gate electrode in each of the N-type MIS transistor and the P-type MIS transistor. As a result, it is possible to make appropriate the threshold voltage of each of the N-type and P-type MIS transistors.

However, the conventional technology described above gives rise to a serious problem in terms of miniaturization of the device. The particular problem will now be described.

FIGS. 16A, 16B and 16C are plan views schematically showing the constructions in the main portions of FIGS. 15G, 15H and 15J, respectively. The distance between the source-drain regions of the N-type MIS transistor and the source-drain regions of the P-type MIS transistor, i.e., the distance between the devices, is set at D.

If the aluminum film 513 in the P-type region is subjected to a wet etching using the resist layer 514 as a mask in the step shown in FIG. 15H, the wet etching proceeds isotropically. Thus, the etching proceeds deep into the region masked by the resist layer 514. As a result, the aluminum film 513 is etched into the N-type region, as shown in FIG. 16B. Therefore, the manufactured transistor is constructed as show n in FIG. 16C. What should be noted is that, in the N-type region, the gate electrode is formed of the aluminum film and the cobalt film differing from each other in the work function. In other words, regions having different threshold voltages are included in the N-type MIS transistor, making it impossible to set the threshold voltage at a low level.

The above-noted problem will now be studied more in detail. Specifically, the etching amount E in the lateral direction shown in FIG. 16B, which is performed by the wet etching, is larger than the height H of the aluminum film, as shown in FIG. 15H. To be more specific, the height H of the aluminum film is about 150 nm. Therefore, the etching amount E in the lateral direction is larger than 150 nm. It follows that, in order to avoid the difficulty, it is necessary to set the distance D between the devices at a value not smaller than twice the etching amount E in the lateral direction, i.e., not smaller than 300 nm, making it very difficult to miniaturize the device. The miniaturization can be achieved to some extent by decreasing the height H of the aluminum film. However, the gate resistance is increased, if the height H of the aluminum film is decreased. Naturally, the decrease in the height H of the aluminum film fails to provide a satisfactory resolution of the problem.

The conventional technique descried above also gives rise to a serious problem in terms of the reliability of, for example, the gate insulating film. This problem will now be described more in detail.

In the prior art describe above, the aluminum film 513 in the P-type region is removed by the wet etching in the step show in FIG. 15H, followed by forming the cobalt film 515 in the aluminum film-removed region in the steps shown in FIGS. 15I and 15J. Therefore, the surface of the gate insulating film 512 is deteriorated by the etching or the like of the aluminum film 513 so as to give bad influences to the reliability of the gate insulating film.

As described above, in the conventional damascene technology, the lateral etching proceeds prominently in the step of etching the dummy gate, making it difficult to achieve miniaturization of the semiconductor device. Also, the reliability of the gate insulating film or the like is adversely affected by the step of etching the dummy gate.

BRIEF SUMMARY OF THE INVENTION

A first object of the present invention is to achieve miniaturization of a semiconductor device in which the gate electrode is formed by using a damascene gate technology or the like.

A second object of the present invention is to ensure reliability of the gate insulating film and the like.

According to a first aspect of the present invention, there is provided a semiconductor device A having an N-type MIS transistor formed in a first region and a P-type MIS transistor formed in a second region, wherein, said N-type MIS transistor includes a first gate insulating film formed on at least the bottom of a first concave portion formed in the first region and a first gate electrode formed on said first gate insulating film;

said P-type MIS transistor includes a second gate insulating film formed on at least the bottom of a second concave portion formed in the second region and a second gate electrode formed on said second gate insulating film;

each of said first and second gate electrodes includes at least one metal-containing film, and at least one of the first and second gate electrodes is of a laminate structure including a plurality of the metal-containing films; and the work function W1 of the metal-containing film constituting at least a part of said first gate electrode and in contact with said first gate insulating film is smaller than the work function W2 of the metal-containing film constituting at least a part of said second gate electrode and in contact with said second gate insulating film.

In the semiconductor device A according to the first aspect of the present invention, it is desirable for the metal-containing film constituting at least a part of the first gate electrode to be selected from a metal film and a metal compound film and for the metal-containing film constituting at least a part of the second gate electrode to be selected from a metal film and a metal compound film. It is desirable for the metal compound film to be selected from a metal silicide film and a metal nitride film. In this case, it is possible for the metal nitride film to contain at least 1% of oxygen.

In the semiconductor device A according to the first aspect of the present invention, it is desirable for the metal-containing film constituting at least a part of the first gate electrode and in contact with the first gate insulating film to be formed along the bottom and the side wall of the first concave portion.

In the semiconductor device A according to the first aspect of the present invention, it is desirable for the metal-containing film constituting at least a part of the second gate electrode and in contact with the second gate insulating film to be formed along the bottom and side wall of the second concave portion.

In the semiconductor device A according to the first aspect of the present invention, it is desirable for the metal-containing film constituting at least a part of the first gate electrode and in contact with the first gate insulating film to have a thickness on a bottom of the first concave portion larger than the thickness on a side wall of the first concave portion.

In the semiconductor device A according to the first aspect of the present invention, it is desirable for the metal-containing film constituting at least a part of the second gate electrode and in contact with the second gate insulating film to have a thickness on a bottom of the second concave portion larger than the thickness on a side wall of the second concave portion.

Further, in the semiconductor device A according to the first aspect of the present invention, it is desirable for the first gate electrode to be formed of a laminate structure consisting of a hafnium nitride film and a cobalt film, for the second gate electrode to be formed of a cobalt film, and for each of said first and second gate insulating films to be formed of a hafnium oxide film.

According to a second aspect of the present invention, there is provided a method B of manufacturing a semiconductor device having an N-type MIS transistor formed in a first region and a P-type MIS transistor formed in a second region, comprising:

forming a first metal-containing film on a first gate insulating film formed on at least the bottom of a first concave portion arranged in said first region and on a second gate insulating film formed on at least the bottom of a second concave portion arranged in said second region;

removing the first metal-containing film formed on one of the first and second gate insulating films;

forming a second metal-containing film on the first metal-containing film remaining on the other of the first and second gate insulating films and on the exposed surface of said one of the first and second gate insulating films;

wherein the work function of one of the first and second metal-containing films constituting at least a part of a first gate electrode of the N-type MIS transistor and in contact with the first gate insulating film is smaller than the work function of the other of the first and second metal-containing films constituting at least a part of a second gate electrode of the P-type MIS transistor and in contact with the second gate insulating film.

According to a third aspect of the present invention, there is provided a method C of manufacturing a semiconductor device having an N-type MIS transistor formed in a first region and a P-type MIS transistor formed in a second region, comprising:

forming a first metal-containing film on a first gate insulating film formed on at least the bottom of a first concave portion arranged in said first region and on a second gate insulating film formed on at least the bottom of a second concave portion arranged in said second region;

removing the first metal-containing film formed on one of the first and second gate insulating films;

forming a third metal-containing film on the first metal-containing film remaining on the other of the first and second gate insulating films and on the exposed surface of said one of the first and second gate insulating films;

removing the third metal-containing film formed on said the other of the first and second gate insulating films; and forming a second metal-containing film on the third metal-containing film remaining on said one of the first and second gate insulating films and on the exposed surface of the first metal-containing film formed on said the other of the first and second gate insulating films;

wherein the work function of one of the first and third metal-containing films constituting at least a part of a first gate electrode of the N-type MIS transistor and in contact with the first gate insulating film is smaller than the work function of the other of the first and third metal-containing films constituting at least a part of a second gate electrode of the P-type MIS transistor and in contact with the second gate insulating film.

According to the semiconductor device A and the manufacturing methods B and C of the semiconductor device of the present invention, the work function of the metal-containing film in contact with the gate insulating film of the N-type MIS transistor is smaller than the work function of the metal-containing film in contact with the gate insulating film of the P-type MIS transistor. As a result, the work functions of the gate electrodes of the N-type and P-type MIS transistors can be made optimum so as to make optimum the threshold voltages of the N-type and P-type MIS transistors.

Also, according to the semiconductor device A and the manufacturing methods B and C of the semiconductor device of the present invention, the gate electrode of at least one of the N-type MIS transistor and the P-type MIS transistor consists of a laminate structure including a plurality of metal-containing films. As a result, the entire resistance of the gate electrode can be lowered, even if the metal-containing film in contact with the gate insulating film has a high resistivity, by arranging metal-containing films having a low resistivity to form upper layers of the laminate structure.

Further, according to the manufacturing methods B and C of the semiconductor device of the present invention, the second metal-containing film is formed on the first and third metal-containing films, making it possible to decrease the thickness of each of the first and third metal-containing films. Therefore, when the metal-containing film (first or third metal-containing film) formed in one of the first and second gate forming regions is removed, it is possible to prevent the etching from proceeding deep into the other region of the first and second gate forming regions. As a result, the semiconductor device can be miniaturized.

Incidentally, in the semiconductor device A and the manufacturing methods B and C of the semiconductor device of the present invention, it is not absolutely necessary for the materials of the metal-containing films in contact with the gate insulating films of the N-type MIS transistor and the P-type MIS transistor to be different from each other. Even if these metal-containing films are formed of the same materials, it suffices for these metal-containing films to be different from each other in composition or crystal structure as far as these films differ from each other in the work function.

According to a fourth aspect of the present invention, there is provided a method D of manufacturing a semiconductor device having an N-type MIS transistor formed in a first region and a P-type MIS transistor formed in a second region, comprising:

forming a first metal-containing film on a first gate insulating film formed on at least the bottom of a first concave portion arranged in the first region and on a second gate insulating film formed on at least the bottom of a second concave portion arranged in the second region; and allowing the first metal-containing film formed on one of the first and second gate insulating films to react with a substance other than the substances contained in the first metal-containing film so as to convert the first metal-containing film into a second metal-containing film;

wherein the work function of one of the first and second metal-containing films constituting at least a part of a first gate electrode of the N-type MIS transistor and in contact with the first gate insulating film, is smaller than the work function of the other of the first and second metal-containing films constituting at least a part of a second gate electrode of the P-type MIS transistor and in contact with the second gate insulating film.

According to a fifth aspect of the present invention, there is provided a method E of manufacturing a semiconductor device having an N-type MIS transistor formed in a first region and a P-type MIS transistor formed in a second region, comprising:

forming a first metal-containing film on a first gate insulating film formed on at least the bottom of a first concave portion arranged in the first region and on a second gate insulating film formed on at least the bottom of a second concave portion arranged in the second region;

allowing the first metal-containing film formed on one of the first and second gate insulating films to react with a first substance other than the substances contained in the first metal-containing film so as to convert the first metal-containing film into a second metal-containing film; and allowing the first metal-containing film formed on the other of the first and second gate insulating films to react with a second substance other than the substances contained in the first metal-containing film so as to convert the first metal-containing film into a third metal-containing film;

wherein the work function of one of the second and third metal-containing films constituting at least a part of a first gate electrode of the N-type MIS transistor and in contact with the first gate insulating film, is smaller than the work function of the other of the second and third metal-containing films constituting at least a part of a second gate electrode of the P-type MIS transistor and in contact with the second gate insulating film.

According to a sixth aspect of the present invention, there is provided a method F of manufacturing a semiconductor device having an N-type MIS transistor formed in a first region and a P-type MIS transistor formed in a second region, comprising:

forming a first metal-containing film on a first gate insulating film formed on at least the bottom of a first concave portion arranged in the first region and on a second gate insulating film formed on at least the bottom of a second concave portion arranged in the second region; and diffusing a first substance other than the substances contained in the first metal-containing film through the first metal-containing film formed on one of the first and second gate insulating films so as to permit the diffused first substance to be precipitated on the surface of said one of the first and second gate insulating films, thereby forming a second metal-containing film consisting of the first substance on said one of the first and second gate insulating films;

wherein the work function of one of the first and second metal-containing films constituting at least a part of a first gate electrode of the N-type MIS transistor and in contact with the first gate insulating film is smaller than the work function of the other of the first and second metal-containing films constituting at least a part of a second gate electrode of the P-type MIS transistor and in contact with the second gate insulating film.

According to a seventh aspect of the present invention, there is provided a method G of manufacturing a semiconductor device having an N-type MIS transistor formed in a first region and a P-type MIS transistor formed in a second region, comprising:

forming a first metal-containing film on a first gate insulating film formed on at least the bottom of a first concave portion arranged in the first region and on a second gate insulating film formed on at least the bottom of a second concave portion arranged in the second region;

diffusing a first substance other than the substances contained in the first metal-containing film through the first metal-containing film formed on one of the first and second gate insulating films so as to permit the diffused first substance to be precipitated on the surface of said one of the first and second gate insulating films, thereby forming a second metal-containing film consisting of the first substance on said one of the first and second gate insulating films; and diffusing a second substance other than the substances contained in the first metal-containing film through the first metal-containing film formed on the other of the first and second gate insulating films so as to permit the diffused second substance to be precipitated on said the other of the first and second gate insulating films, thereby forming a third metal-containing film consisting of the second substance on said the other of the first and second gate insulating films;

wherein the work function of one of the second and third metal-containing films constituting at least a part of a first gate electrode of the N-type MIS transistor and in contact with the first gate insulating film, is smaller than the work function of the other of the second and third metal-containing films constituting at least a part of a second gate electrode of the P-type MIS transistor and in contact with the second gate insulating film.

According to the methods D to G of the present invention for manufacturing the semiconductor device, the work function of the metal-containing film in contact with the gate insulating film of the N-type MIS transistor is smaller than the work function of the metal-containing film in contact with the gate insulating film of the P-type MIS transistor. As a result, it is possible to make optimum the work functions of the gate electrodes of the N-type and P-type MIS transistors. It follows that the threshold voltages of the N-type and P-type MIS transistors can be made optimum.

Also, according to the methods D to G of the present invention for manufacturing the semiconductor device, the gate electrode can be formed without etching the metal-containing film formed on the gate insulating film so as to prevent the reliability of the gate insulating film from being lowered.

Incidentally, in the semiconductor device A and the manufacturing methods B to G of the semiconductor device of the present invention, it is desirable for the work function W1 (in the case of the N-type MIS transistor) to be positioned on the side of the conduction band relative to the center of the band gap (½ position of the band gap) of the semiconductor constituting the semiconductor substrate. It is also desirable for the work function W2 (in the case of the P-type MIS transistor) to be positioned on the side of the valence band relative to the center of the band gap. Also, it suffices for the thickness of that region of the metal-containing film which is in contact with the gate insulating film, said thickness determining the threshold voltage of the MIS transistor, to be not smaller than the thickness at which a desired threshold voltage can be obtained. Preferably, the thickness of the metal-containing film in question should be equal to at least the thickness of a layer consisting of about 10 atoms arranged in the thickness direction of the film.

Additional objects and advantages of the invention will be set forth in the description which follows, and in part will be obvious from the description, or may be learned by practice

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.

(Embodiment 1)

An example of a first embodiment of the present invention will now be described with reference to FIGS. 1A to 1I.

Figure 1A:
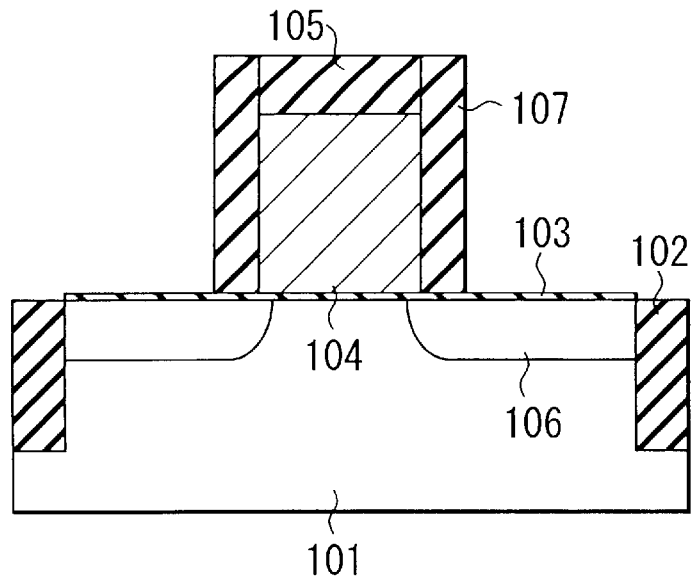
FIGS. 1A to 1I are cross sectional views showing a method of manufacturing a semiconductor device according to a first embodiment of the present invention.

In the first step, an element isolating region 102 of an STI structure is formed on a silicon substrate 101, as shown in FIG. 1A. Then, a silicon oxide film 103 having a thickness of about 2 to 6 nm is formed as a dummy insulating film that is to be removed later. Further, a laminate structure consisting of a polysilicon film 104 having a thickness of about 150 nm and a silicon nitride film 105 having a thickness of about 50 nm is formed as a dummy gate that is to be removed later. These dummy insulating film and dummy gate are formed by the ordinary technology such as a film-forming technology of oxidation, CVD or the like, the lithography technology, the RIE technology, or the like. Then, impurity ions are implanted into the silicon substrate 101 using the dummy gate (polysilicon film 104 and the silicon nitride film 105) as a mask so as to form an extension region constituting source-drain diffusion layers 106. After formation of the extension region, a gate side wall insulating film consisting of a silicon nitride film 107 having a width of about 20 to 40 nm is formed by the CVD technology and the RIE technology, as shown in FIG. 1A.

Figure 1B:
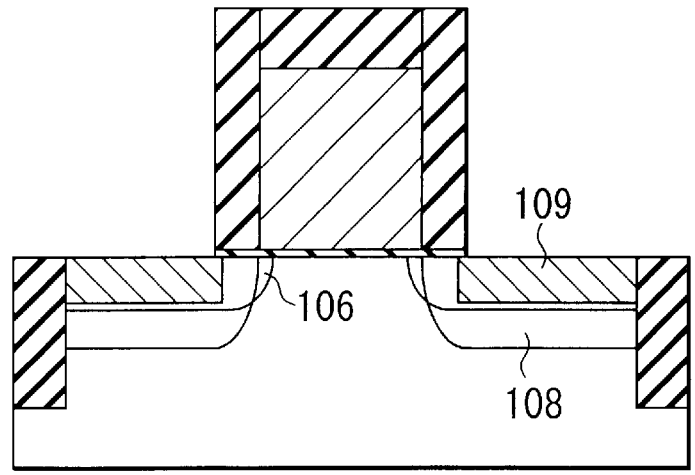

In the next step, impurity ions are implanted by using the dummy gate (the polysilicon film 104 and the silicon nitride film 105) and the gate side wall insulating film (silicon nitride film 107) as a mask so as to form diffusion layers of a high impurity concentration forming source-drain diffusion layers 108. Further, a silicide film 109 (a cobalt silicide film or a titanium silicide film) having a thickness of about 40 nm is formed in only the source-drain regions by the salicide process technology using the dummy gate as a mask, as shown in FIG. 1B.

Figure 1C:
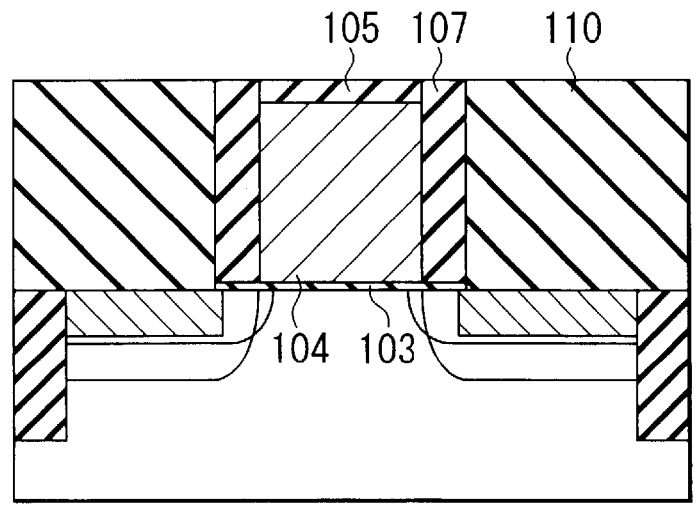

Then, an interlayer insulating film 110 is formed by depositing, for example, silicon oxide by the CVD method, followed by flattening the interlayer insulating film 110 by a CMP technology so as to expose the surfaces of the silicon nitride films 105 and 107, as shown in FIG. 1C.

Figure 1D:
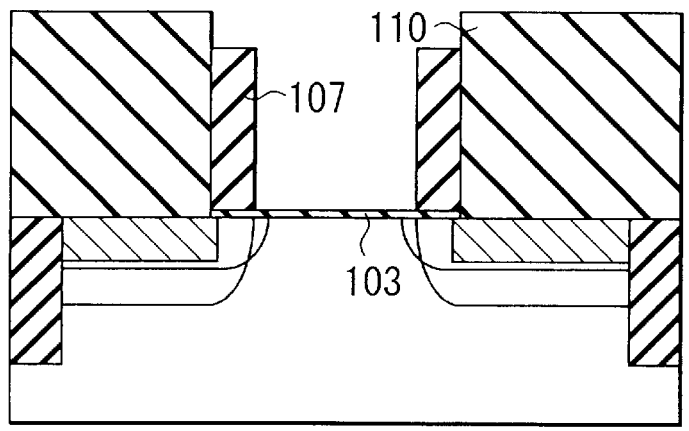

Further, the silicon nitride film 105 in an upper portion of the dummy gate is selectively removed with, for example, phosphoric acid relative to the interlayer insulating film 110. In this step, the silicon nitride film 107 is also etched to about the height of the polysilicon film 104. Then, the polysilicon film 104 is selectively removed relative to the interlayer insulating film 110 and the silicon nitride film 107 by the etching technology using radicals of halogen atoms such as fluorine atoms, as shown in FIG. 1D.

Figure 1E:
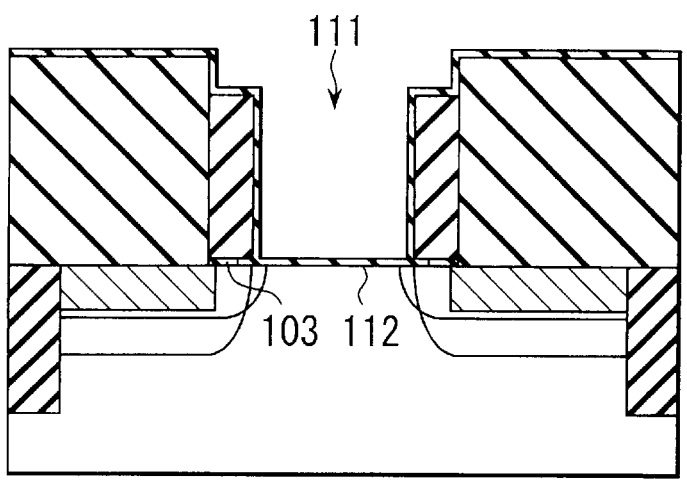

In the next step, a groove 111 is formed by removing the dummy silicon oxide film 103 by a wet etching using a dilute hydrofluoric acid, followed by forming on the entire surface a hafnium oxide ($HfO_2$) film 112, which is a high dielectric constant film, as gate insulating film, as shown in FIG. 1E. The hafnium oxide film is formed by forming first a hafnium nitride (HfN) film by a CVD method using $HfCl_4$ and $NH_3$ or by a sputtering method using hafnium nitride (HfN) or hafnium as a target, followed by oxidizing the resultant hafnium nitride film.

Figure 1F:
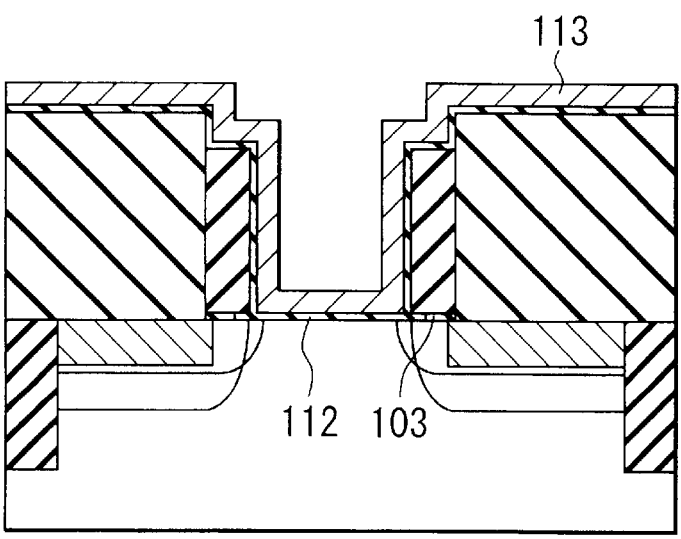

After formation of the hafnium oxide film 112, a hafnium nitride film 113 having a work function of about 4 eV is formed by a CVD method or a sputtering method on the entire surface in a thickness of about 10 nm or smaller than 10 nm, as shown in FIG. 1F.

The steps shown in FIGS. 1A to 1F are applied to each of the N-type MIS transistor forming region and the P-type MIS transistor forming region, though only one of these two regions is shown in the drawings. In the subsequent steps, however, both the N-type MIS transistor forming region and the P-type MIS transistor forming regions are shown in the drawings.

Figure 1G:
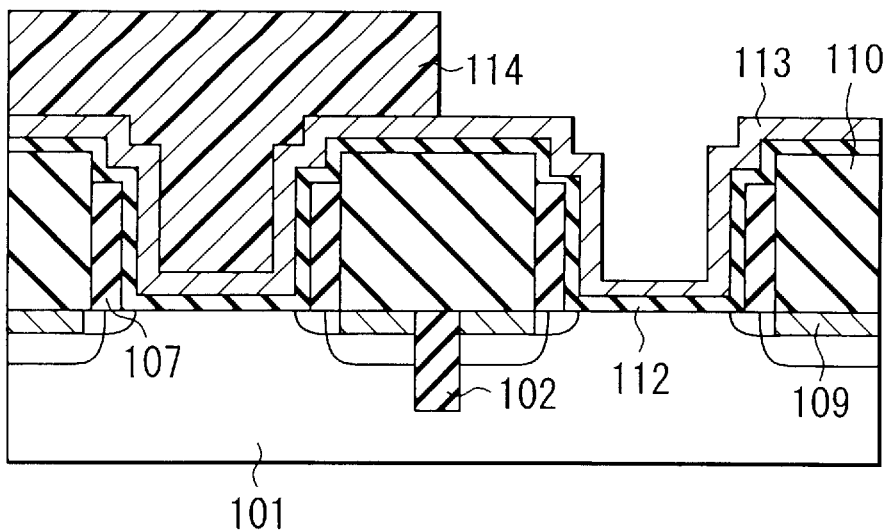
Figure 2A:
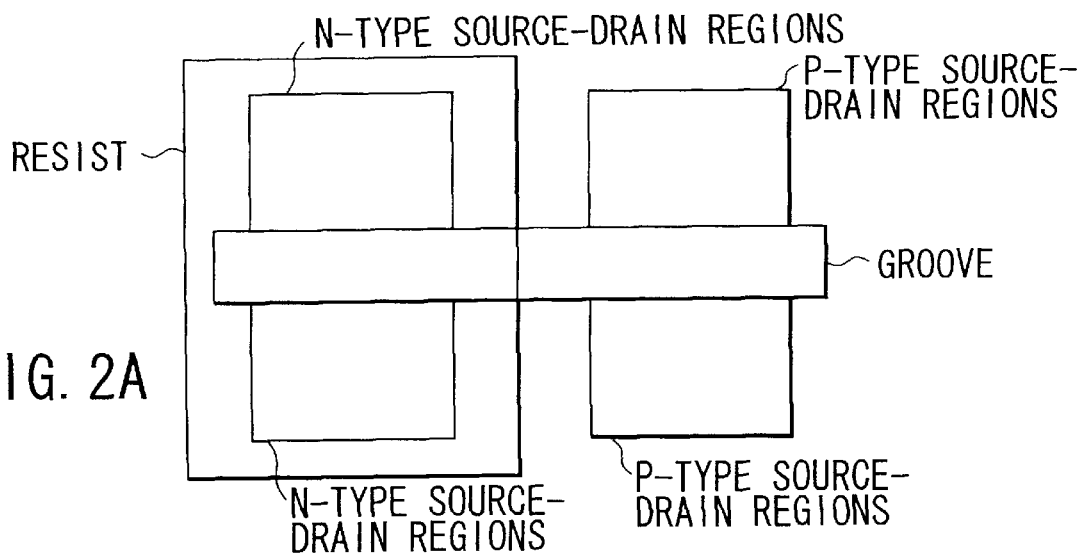
FIGS. 2A to 2C are plan views showing the effects produced by the method of manufacturing a semiconductor device according to the first embodiment of the present invention.

After the step shown in FIG. 1F, a resist layer 114 is formed by a lithography technology on the entire region except the P-type MIS transistor forming region, as shown in FIG. 1G. FIG. 2A is a plan view schematically showing the gist portion of the structure shown in FIG. 1G.

Figure 1H:
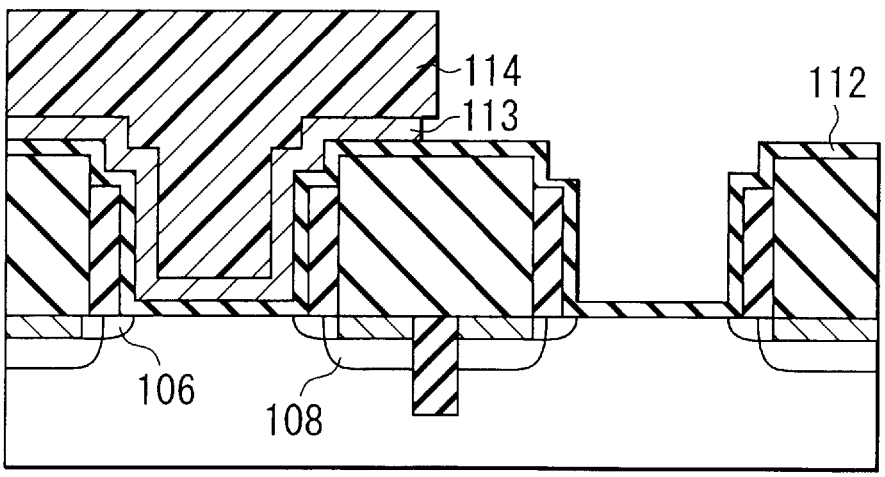
Figure 2B:
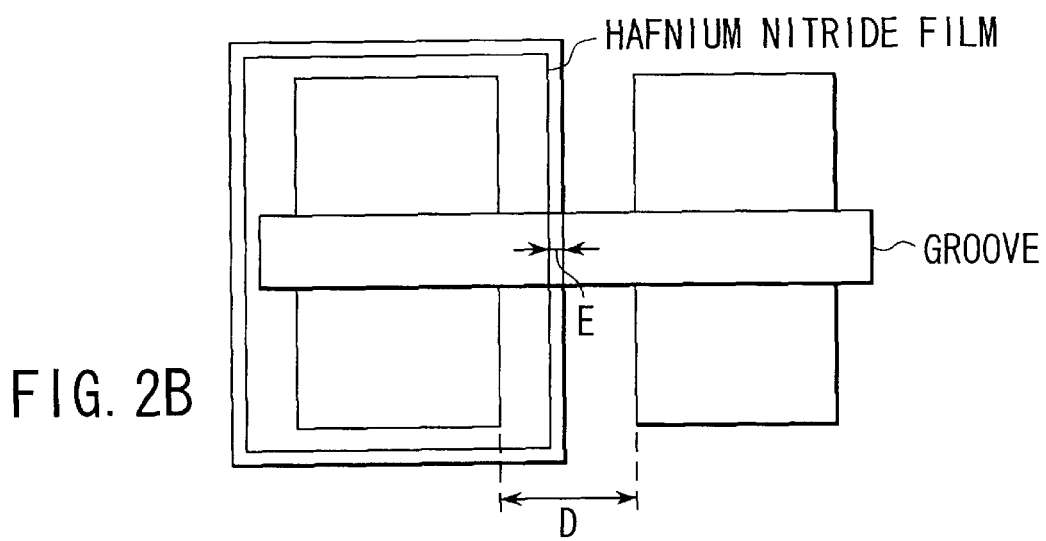

In the next step, the hafnium nitride film 113 is removed from only the P-type MIS transistor forming region by a wet etching using an aqueous hydrogen peroxide solution. FIG. 2B is a plan view showing the gist portion of the structure in this step. The hafnium oxide film 112 forming the gate insulating film is insoluble in the aqueous hydrogen peroxide solution and, thus, is not etched in the step of etching the hafnium nitride film 113. It should also be noted that the hafnium nitride film 113, which is formed very thin (about 10 nm thick), is not etched deeply such that the etching reaches the N-type MIS transistor forming region, unlike the conventional technology, as shown in FIG. 1H. To be more specific, since the thickness of the hafnium nitride film 113 is about 10 nm, the etching amount E in the lateral direction is also about 10 nm. It follows that, if the distance D between the N-type and P-type MIS transistor forming regions is not smaller than about 20 nm, it is possible to eliminate the problem inherent in the conventional technique, thereby markedly miniaturizing the semiconductor device.

Figure 1I:
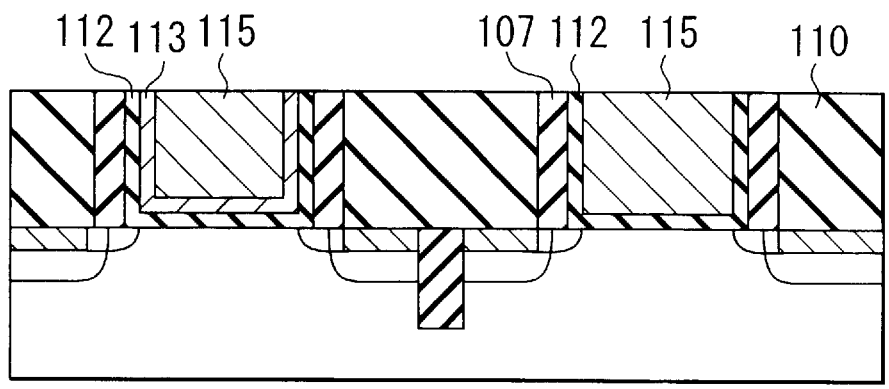
Figure 2C:
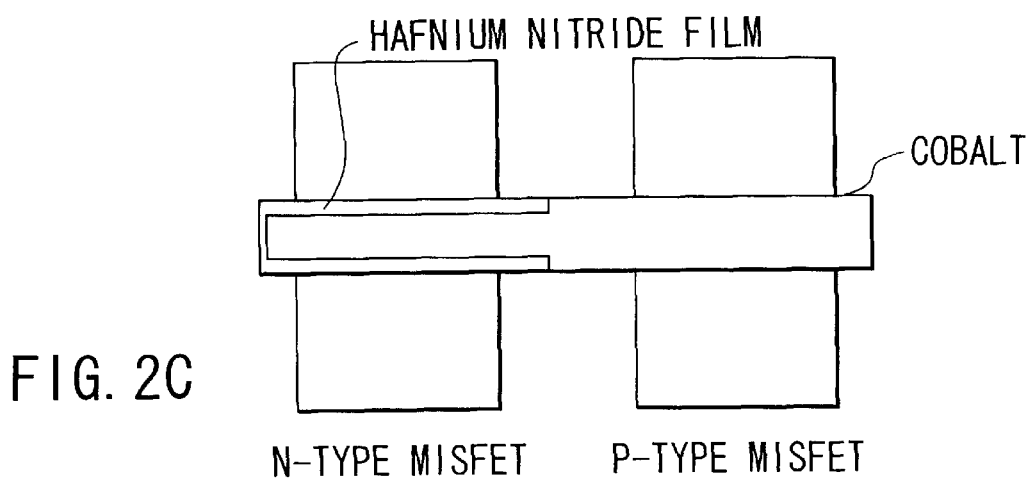

In the next step, the resist layer 114 is removed, followed by depositing on the entire surface a noble metal having a work function of about 5 eV, e.g., a cobalt film 115. The cobalt film can be formed by a sputtering method or a CVD method using $Co(CO)_4$, $Co_2(CO)_8$, $CoF_2$, $CoCl_2$ or $CoBr_2$ as a gas source. Then, the cobalt film 115, the hafnium nitride film 113 and the hafnium oxide film 112 are flattened by a CMP technology so as to expose the interlayer insulating film 110 to the outside, as shown in FIG. 1I. FIG. 2C is a plan view schematically showing the gist portion of the structure in this step.

By the processes described above, formed is a C-MIS transistor in which the gate electrode of the N-type MIS transistor is formed of a laminate structure consisting of the hafnium nitride film 113 and the cobalt film 115, and the gate electrode of the P-type MIS transistor consists of a single layer structure of the cobalt film 115.

In the first embodiment described above, it is possible to allow the work function of that portion of the gate electrode of the N-type MIS transistor which is in contact with the gate insulating film to be smaller than the work function of that portion of the gate electrode of the P-type MIS transistor which is in contact with the gate insulating film. In the embodiment described above, the work function of the hafnium nitride film 113 is about 4 eV; whereas the work function of the cobalt film 115 is about 5 eV. Therefore, it is possible to make optimum the work function of the gate electrode of each of the N-type and P-type MIS transistors so as to make optimum the threshold voltages of these two transistors.

Also, in the embodiment described above, the hafnium nitride film 113 is very thin. Therefore, it is possible to prevent the hafnium nitride film 113 from being etched deep into the N-type region in the step of removing the hafnium nitride film 113 in the P-type region. It follows that it is possible to markedly miniaturize the semiconductor device. Further, in the embodiment described above, the gate electrode of the N-type MIS transistor is of a laminate structure consisting of the hafnium nitride film 113 and the cobalt film 115 having a low resistivity and formed on the hafnium nitride film 113. It follows that it is possible to make optimum the work function and, at the same time, to lower the resistance of the gate electrode.

Figure 3:
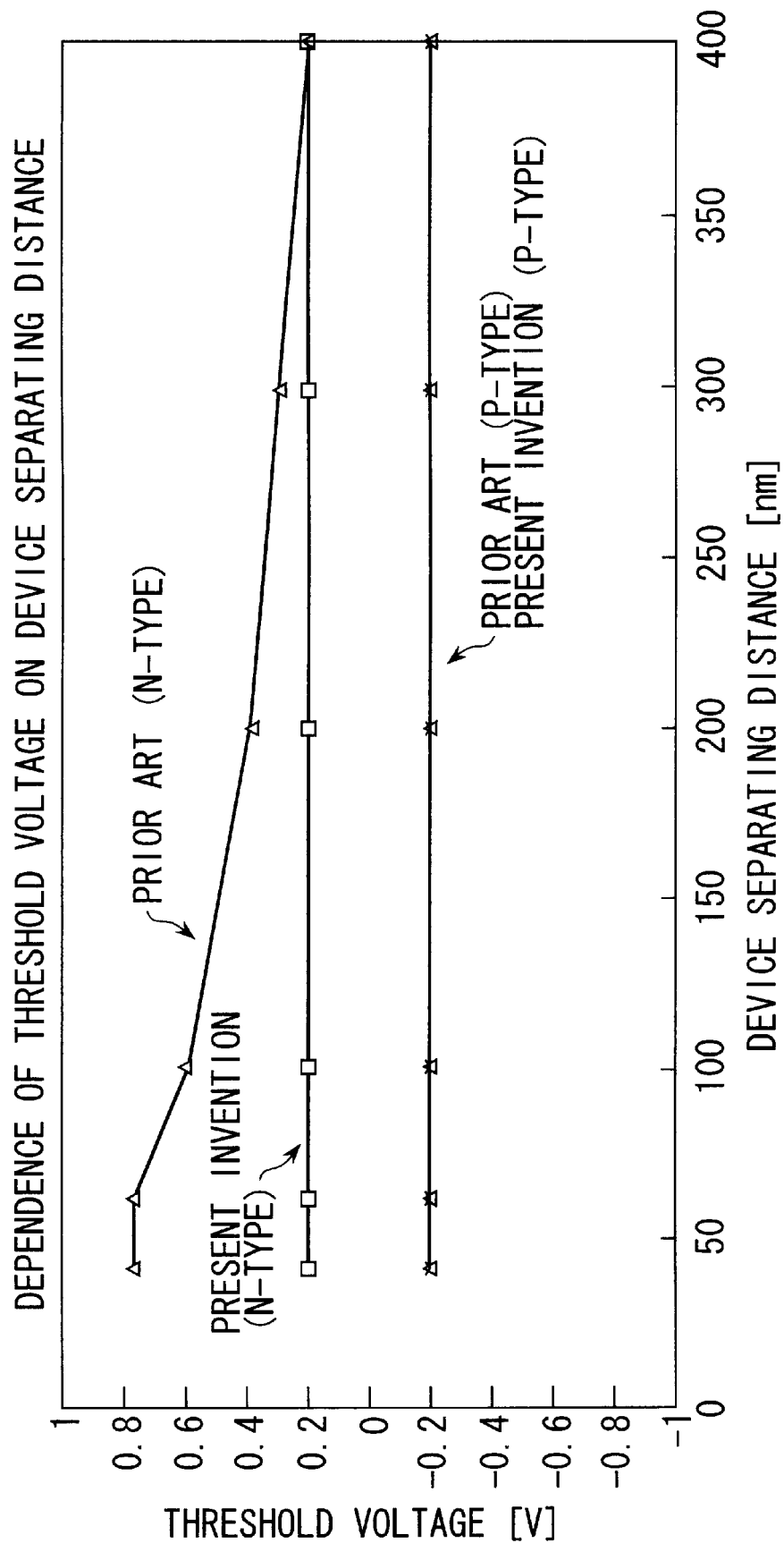
FIG. 3 is a graph showing the relationship between the distance between the adjacent devices and the threshold voltage in respect of the MIS transistors manufactured by the manufacturing method according to the first embodiment of the present invention and by the conventional method.

FIG. 3 is a graph showing the relationship between the threshold voltage and the distance D shown in FIG. 2B, i.e., the device separating distance between the N-type and P-type MIS transistors, with respect to the N-type and P-type MIS transistors of the present invention and the conventional N-type and P-type MIS transistors.

When it comes to the P-type MIS transistors, the threshold voltage is constant and low, i.e., about −0.2V, until the device separating distance D is increased to about 400 nm in each of the embodiment of the present invention and the conventional technique. When it comes to the N-type MIS transistors, however, the threshold voltage begins to be increased where the device separating distance D is shorter than 300 nm in the case of the conventional technique. This is because a part of the N-type MIS transistor is formed of a metal having a work function of about 5.0 eV. In the embodiment of the present invention, however, the threshold voltage is maintained constant even where the semiconductor device is miniaturized such that the device separating distance is decreased to 40 nm.

In the embodiment described above, the gate electrode of the N-type MIS transistor is of a laminate structure consisting of a hafnium nitride film and a cobalt film, and the gate electrode of the P-type MIS transistor is of a single layer structure consisting of a cobalt layer alone. In this embodiment, however, it is possible to modify the gate electrode structure in various fashions. These modifications will now be described in the following.

Figure 4:
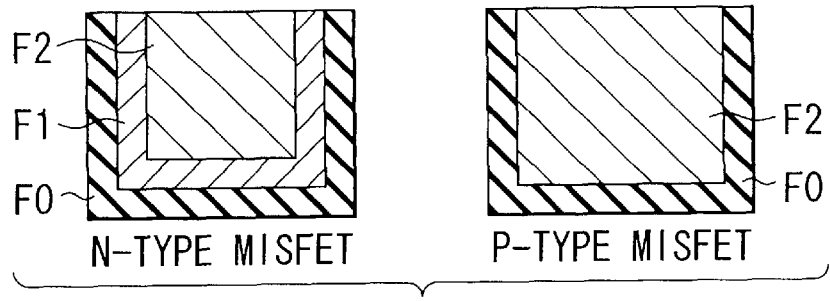
FIG. 4 schematically shows as an example the basic construction of the semiconductor device according to the first embodiment of the present invention.
Figure 5:
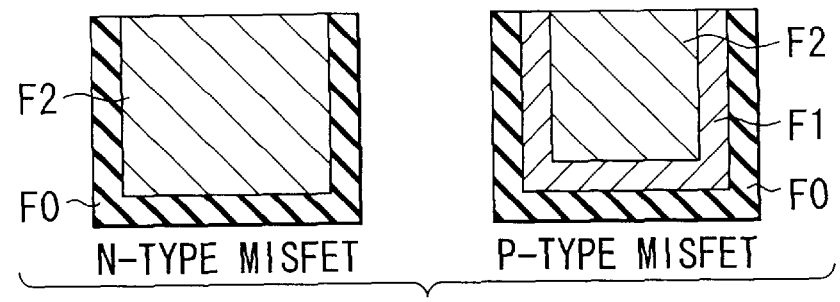
FIG. 5 schematically shows as another example the basic construction of the semiconductor device according to the first embodiment of the present invention.
Figure 6:
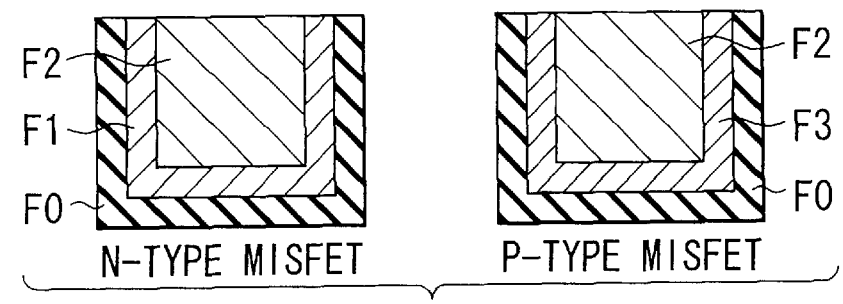
FIG. 6 schematically shows as another example the basic construction of the semiconductor device according to the first embodiment of the present invention.

The basic gate structures in this embodiment include structure A shown in FIG. 4, structure B shown in FIG. 5, and structure C shown FIG. 6. These basic structures A, B and C include, for example, structure D shown in FIG. 7 as a variation. In FIGS. 4 to 7, only the gate insulating films and the gate electrodes are schematically illustrated.

In structure A shown in FIG. 4, the gate electrode of the N-type MIS transistor is of a laminate structure consisting of a first metal-containing film F1 and a second metal-containing film F2 and formed on a gate insulating film F0. On the other hand, the gate electrode of the P-type MIS transistor consists of the second metal-containing film F2 formed on the gate insulating film F0. In this case, the work function of the first metal-containing film F1 is smaller than the work function of the second metal-containing film F2.

The method of forming the structure A comprises the step of forming the first metal-containing film F1 on the gate insulating film F0 in the gate forming regions of both the N-type and P-type MIS transistors, the step of removing the first metal-containing film F1 from the gate forming region for the P-type MIS transistor, and the step of forming the second metal-containing film F2 on the first metal-containing film F1 in the gate forming region for the N-type MIS transistor and on the gate insulating film F0 in the gate forming region for the P-type MIS transistor so as to fill the concave portions in the gate forming regions of the N-type and P-type MIS transistors.

In structure B shown in FIG. 5, the gate electrode of the P-type MIS transistor consists of a laminate structure consisting of the first metal-containing film F1 and the second metal-containing film F2 and formed on the gate insulating film F0. On the other hand, the gate electrode of the N-type MIS transistor consists of the second metal-containing film F2 formed on the gate insulating film F0. In this case, the work function of the second metal-containing film F2 is smaller than the work function of the first metal-containing film F1.

The method of forming the structure B comprises the step of forming the first metal-containing film F1 on the gate insulating film F0 in the gate forming region in each of both the N-type and P-type MIS transistors, the step of removing the first metal-containing film F1 in the gate forming region for the N-type MIS transistor, and the step of forming the second metal-containing film F2 on the first metal-containing film F1 in the gate forming region for the P-type MIS transistor and on the gate insulating film F0 in the gate forming region for the N-type MIS transistor so as to fill the concave portion in the gate forming region in each of the N-type and P-type MIS transistors.

A specific example of structure A is as shown in FIGS. 1A to 1I. A major portion of the manufacturing method shown in FIGS. 1A to 1I can be employed for forming the structure B, except that materials adapted for structure B are used for forming the constituents of the semiconductor device. A main difference between structures A and B is that, in structure B, the P-type MIS transistor region is masked in place of the N-type MIS transistor region by the resist layer in the step shown in FIG. 1G.

In structure C shown in FIG. 6, the gate electrode of the N-type MIS transistor is of a laminate structure consisting of the first metal-containing film F1 and the second metal-containing film F2 and formed on the gate insulating film F0. On the other hand, the gate electrode of the P-type MIS transistor is of a laminate structure consisting of a third metal-containing film F3 and the second metal-containing film F2 and formed on the gate insulating film F0. In this case, the work function of the first metal-containing film F1 is smaller than the work function of the third metal-containing film F3.

Figure 8A:
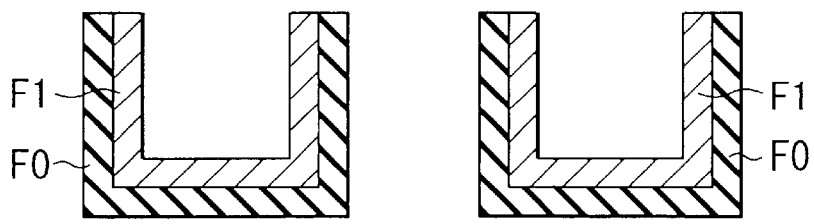
FIGS. 8A to 8E collectively show main manufacturing steps for obtaining the basic construction shown in FIG. 6.
Figure 8B:
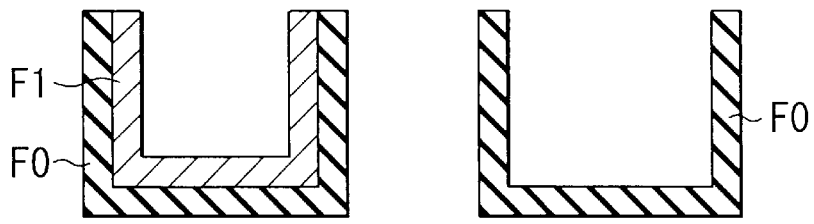
Figure 8C:
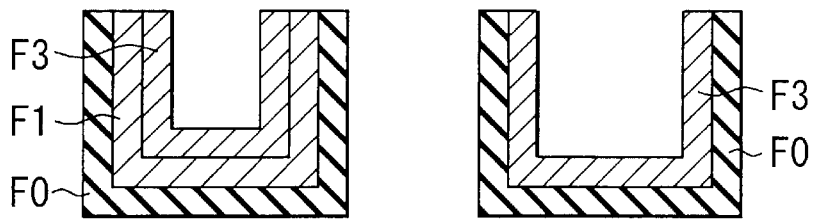
Figure 8D:
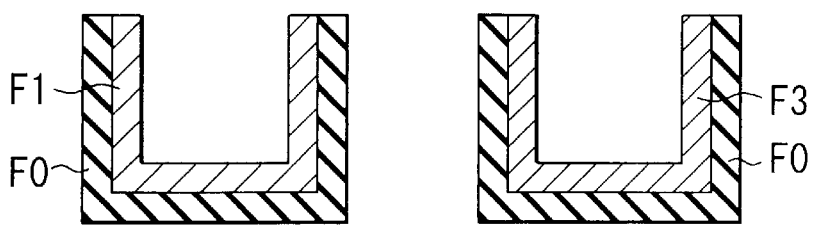
Figure 8E:
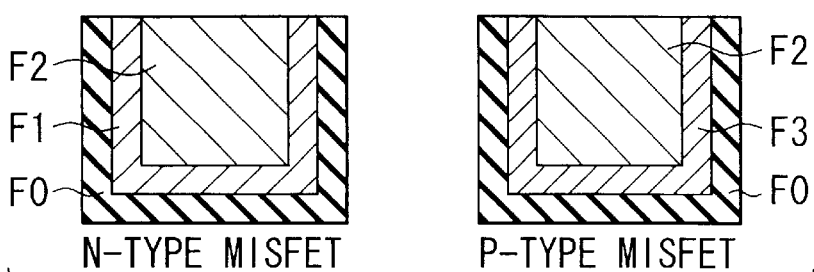

FIGS. 8A to 8E collectively show the method of forming structure C. Specifically, the forming method comprises the step forming the first metal-containing film F1 on the gate insulating film F0 in the gate forming region in each of the N-type and P-type MIS transistors as shown in FIG. 8A, the step of removing the first metal-containing film F1 in the gate forming region of the P-type MIS transistor as shown in FIG. 8B, the step of forming the third metal-containing film F3 on the first metal-containing film F1 in the gate forming region for the N-type MIS transistor and on the gate insulating film F0 in the gate forming region for the P-type MIS transistor as shown in FIG. 8C, the step of removing the third metal-containing film in the gate forming region for the N-type MIS transistor as shown in FIG. 8D, and the step of forming the second metal-containing film F2 on the first metal-containing film F1 in the gate forming region for the N-type MIS transistor and on the third metal-containing film F3 in the gate forming region for the P-type MIS transistor so as to fill the concave portion in the gate forming region in each of the N-type and P-type MIS transistors, as shown in FIG. 8E.

Figure 7:
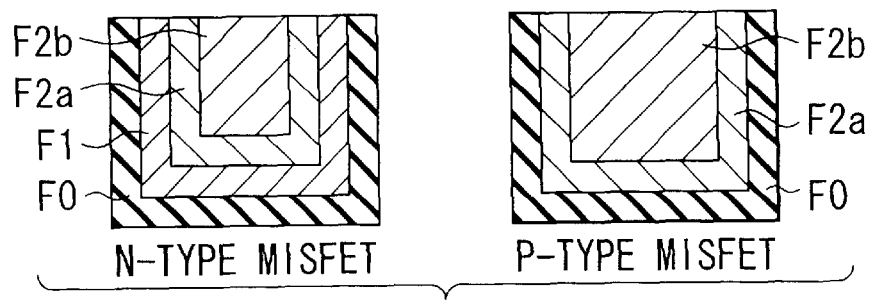
FIG. 7 schematically shows as another example the basic construction of the semiconductor device according to the first embodiment of the present invention.

Incidentally, each of constructions A, B and C described above includes structure D in which the second metal-containing film F2 is of a laminate structure consisting of a plurality of films, as shown in FIG. 7. In the example shown in FIG. 7, the second metal-containing film F2 of each of the N-type and P-type MIS transistors is of a laminate structure consisting of metal-containing films F2a and F2b, as in the example shown in FIG. 4.

Structures A to D will now be described more in detail.

(1) In structure A shown in FIG. 4, the first metal-containing film F1 is used as a barrier metal for determining the threshold voltage of the N-type MIS transistor. On the other hand, the second metal-containing film F2 is used as a barrier metal for determining the threshold voltage of the P-type MIS transistor.

The first metal-containing film F1 is formed of a material having a work function effective for making optimum the threshold voltage of the N-type MIS transistor, i.e., work function of 4.6 eV or less, preferably about 4 eV, and capable of applying an etching such as a wet etching or a dry etching using radical atoms or radical molecules without doing damage to the material. The typical material includes HfN and ZrN. These nitrides have a work function of about 4 eV and are adapted for use as an N-type barrier metals.

The second metal-containing film F2 is formed of a material having a work function effective for making optimum the threshold voltage of the P-type MIS transistor, i.e., work function of at least 4.6 eV, preferably about 5 eV, and having a low resistivity effective for lowering the resistance of the gate electrode. Many noble metals have a work function of about 5 eV and, thus, adapted for forming the second metal-containing film F2. It should be noted that Co has a resistivity of about 5 $\mu\Omega\cdot$cm, Ni has a resistivity of about 6 $\mu\Omega\cdot$cm, and Pt has a resistivity of about 10 $\mu\Omega\cdot$cm. Incidentally, W and $CoSi_2$, which are widely used nowadays as the gate electrode materials, have a resistivity of about 5 $\mu\Omega\cdot$cm, and about 20 $\mu\Omega\cdot$cm, respectively. Clearly, Co, Ni and Pt are adapted for use as a material used for forming the second metal-containing film F2. Particularly, it is desirable to use Co for forming the second metal-containing film F2.

The gate insulating film F0 is not particularly limited, though it is desirable to use $HfO_2$ in the case HfN is used as a barrier metal because a thermal reaction is unlikely to take place at the interface between the HfN layer and the $HfO_2$ layer.

(2) In structure B shown in FIG. 5, the first metal-containing film F1 is used as a barrier metal for determining the threshold voltage of the P-type MIS transistor. On the other hand, the second metal-containing film F2 is used as a barrier metal for determining the threshold voltage of the N-type MIS transistor.

The first metal-containing film F1 is formed of a material having a work function effective for making optimum the threshold voltage of the P-type MIS transistor, i.e., work function of 4.6 eV or more, preferably about 5 eV, and capable of applying an etching such as a wet etching or a dry etching using radical atoms or radical molecules without doing damage to the material. The typical material includes $WN_x$, $WSi_xN_y$, and TiC.

The second metal-forming film F2 is formed of a material having a work function effective for making optimum the threshold voltage of the N-type MIS transistor, i.e., work function of 4.6 eV or less, preferably about 4 eV, and having a low resistivity effective for lowering the resistance of the gate electrode. The typical material suitable for use for forming the second metal-containing film F2 is Al and an alloy thereof.

(3) In structure C shown in FIG. 6, the first metal-containing film F1 is used as a barrier metal for determining the threshold voltage of the N-type MIS transistor. The third metal-containing film F3 is used as a barrier metal for determining the threshold voltage of the P-type MIS transistor. Further, the second metal-containing film F2 is used as an electrode material having a low resistivity.

The first metal-containing film F1 is formed of a material having a work function effective for making optimum the threshold voltage of the N-type MIS transistor, i.e., work function of 4.6 eV or less, preferably about 4 eV, and capable of applying an etching such as a wet etching or a dry etching using radical atoms or radical molecules without doing damage to the material. The typical material includes HfN.

The third metal-forming film F3 is formed of a material having a work function effective for making optimum the threshold voltage of the P-type MIS transistor, i.e., work function of at least 4.6 eV, preferably about 5 eV, and capable of applying an etching without doing damage to the material. Typically, $WN_x$ is used for forming the third metal-containing film F3. Further, the second metal-containing film F2 is formed of a material having a low resistivity. Typical materials are Al and an alloy thereof.

(4) In structure D shown in FIG. 7, in which the structure A shown in FIG. 4 or the structure B shown in FIG. 5 is used as the basic structure, the film F2a on the lower side of the second metal-containing film F2 should be formed of a material having a work function effective for making optimum the threshold voltage of the N-type or P-type MIS transistor, i.e., work function of 4.6 eV or less, preferably 4 eV, in the case of the N-type MIS transistor, work function of at least 4.6 eV, preferably 5 eV in the case of the P-type MIS transistor. On the other hand, the film F2b on the upper side of the second metal-containing film F2 should be formed of a material having a low resistivity.

In structure D shown in FIG. 7, in which the structure C shown in FIG. 6 is used as the basic structure, each of the first metal-containing film F1 and the third metal-containing film F3 is positioned on the lower side of the second metal-containing film F2. Therefore, it is impossible to obtain the effect that the film F2a on the lower side of the second metal-containing film F2 is used for making optimum the threshold voltage of the transistor. However, the film F2a produces the effect of suppressing the metal diffusion from the film F2b on the upper side of the second metal-containing film F2 into the gate insulating film F0.

In a typical example of structure D in which the structure A is used as the basic structure, the first metal-containing film F1 is formed of HfN, the film F2a on the lower side of the second metal-containing film is formed of $RuO_2$, and the film F2b on the upper side of the second metal-containing film is formed of Al.

(5) In each of structures A, B and C, it is desirable to use an electrically conductive metal compound for forming the first metal-containing film F1. The barrier metals for the N-type MIS transistor include, for example, hafnium nitride, zirconium nitride, titanium nitride, tantalum nitride and niobium nitride. On the other hand, the barrier metals for the P-type MIS transistor include, for example, tungsten nitride and tungsten silicon nitride.

(6) In each of structures A and C, it is desirable to use platinum, palladium, nickel, cobalt, rhodium, ruthenium, rhenium, iridium, gold, silver, copper or an alloy thereof for forming the second metal-containing film F2.

(7) In each of structures A, B and C, it is desirable to use a film containing an electrically conductive metal compound as the second metal-containing film F2.

The metal compounds used for forming the second metal-containing film F2 include metal oxides such as ruthenium oxide, iridium oxide, rhenium oxide, platinum oxide and rhodium oxide. Many noble metal oxides are electrically conductive and, thus, provide a work function adapted for the P-type MIS transistor.

It is also possible to use metal silicides such as platinum silicide, palladium silicide and nickel silicide as the metal compound contained in the second metal-containing film F2. These metal silicides provide a work function adapted for the N-type or P-type MIS transistor, particularly, P-type MIS transistor.

Further, metal nitrides such as hafnium nitride, zirconium nitride, titanium nitride, tantalum nitride and niobium nitride can also be used as the metal compounds contained in the second metal-containing film F2. These metal nitrides provide a work function adapted for the N-type MIS transistor.

(8) In structure D, it is desirable to use a metal compound film as the lowermost film of the second metal-containing film F2. The metal compounds used for forming the lowermost film of the second metal-containing film F2 include, for example, metal oxides such as ruthenium oxide, iridium oxide, rhenium oxide, platinum oxide, and rhodium oxide; metal silicides such as platinum silicide, palladium silicide, and nickel silicide; metal nitrides such as hafnium nitride, zirconium nitride, titanium nitride, tantalum nitride, niobium nitride, and tungsten nitride; and tungsten silicon nitride.

(9) In structure C, it is desirable to use tungsten nitride or tungsten silicon nitride for forming the third metal-containing film F3.

(10) In each of the structures A to D, it is possible for the gate insulating film F0 to be formed of $HfO_2$, $ZrO_2$, $TiO_2$, silicon nitride, $Al_2O_3$, $Ta_2O_5$, $Nb_2O_5$, $Y_2O_3$, $CeO_2$, a zirconium oxide containing yttrium, a compound containing barium, strontium, titanium and oxygen, a compound containing lead, zirconium, titanium and oxygen, or silicon oxide. These $HfO_2$, $ZrO_2$, $TiO_2$, $Ta_2O_5$, $Nb_2O_5$, $Y_2O_3$, $CeO_2$, and a zirconium oxide containing yttrium can be directly formed by a CVD method by introducing an oxygen gas into the gases of $HfCl_4$, $ZrCl_4$, $TiCl_4$, $TaCl_5$, $NbCl_5$, $Y(Thd)_3$, where Thd represents 2,2,6,6-tetramethyl-3,5-heptaneodinate, $Ce(Thd)_4$ and a mixture of $Zr(Thd)_4$ and $Y(Thd)_3$, respectively.

A film of each of the metal oxides noted above can be formed as follows. Specifically, a metal nitride, i.e., HfN, ZrN, TiN, TaN, NbN, YN, CeN or a zirconium nitride film containing yttrium, is formed first by using, for example, $NH_3$ in place of the oxygen gas, followed by converting the metal nitride into metal oxide by means of a thermal oxidation. In the case of employing the thermal oxidation method, it is desirable to subject a nitride film having a thickness not larger than 5 nm to the thermal oxidation or to repeat a plurality of times the deposition of the nitride film having a thickness not larger than 5 nm and the oxidation of the nitride film in order to prevent nitrogen from remaining within the formed oxide film. It should be noted in this connection that, if the nitride film having a large film thickness is subjected to the thermal oxidation at a low temperature not higher than 500° C., nitrogen remains in the resultant thermal oxide film.

It is also possible to form on a silicon substrate, before formation of the metal oxide film noted above, a silicon oxide film by thermal oxidation, an oxynitride film by thermal oxidation under an NO gas atmosphere, or a silicon nitride film by a CVD method, followed by forming the metal oxide film described above so as to form the gate insulating film F0 of a laminate structure.

(11) In the case of using HfN, ZrN or TiN for forming the lowermost layer of the gate electrode, it is possible to use an aqueous hydrogen peroxide solution for etching the lowermost layer of the gate electrode. In the etching step using the aqueous hydrogen peroxide solution, it is necessary for the gate insulating film F0 not to be etched. It should be noted that $HfO_2$, $ZrO_2$, $TiO_2$, $Si_3N_4$, $Al_2O_3$, $Ta_2O_5$, $Nb_2O_5$, $Y_2O_3$, $CeO_2$, a zirconium oxide containing yttrium, a compound containing barium, strontium, titanium and oxygen, a compound containing lead, zirconium, titanium and oxygen, silicon oxide and silicon oxynitride containing at least 1% of nitrogen are insoluble in an aqueous hydrogen peroxide. Therefore, where the gate insulating film F0 is formed of any of the materials noted above, no problem is generated.

It should be noted that TaN and NbN are soluble in a mixed acid containing hydrochloric acid and nitric acid. Therefore, where the lowermost layer of the gate electrode is formed of TaN or NbN, it is necessary for the gate insulating film F0 not to be soluble in the mixed acid noted above. It follows that it is possible to use $HfO_2$, $ZrO_2$, $TiO_2$, $Si_3N_4$, silicon oxide or silicon oxynitride containing at least 1% of nitrogen, which are insoluble in the mixed acid containing hydrochloric acid and nitric acid, for forming the gate insulating film F0.

Aluminum is soluble in a mixed solution containing phosphoric acid and nitric acid. Therefore, where aluminum is used for forming the lowermost layer of the gate electrode, it is possible to use $HfO_2$, $ZrO_2$, $TiO_2$, $Ta_2O_5$, $Nb_2O_5$, a zirconium oxide containing yttrium, a compound containing barium, strontium, titanium and oxygen, a compound containing lead, zirconium, titanium and oxygen, silicon oxide or silicon oxynitride containing at least 1% of nitrogen, which are insoluble in the mixed solution containing phosphoric acid and nitric acid, for forming the gate insulating film F0.

(12) In the case of using the metal nitride noted above, i.e., HfN, ZrN, TiN, TaN or NbN, for forming the lowermost layer of the gate electrode, it is necessary to take the resistance to etching into consideration in determining the combination of the metal nitride film and the gate insulating film. In addition, it is desirable to satisfy the condition given below. Specifically, the Gibbs free energy of the oxide of the metal constituting the metal nitride should be lower than the Gibbs free energy of the metal oxide or silicon oxide used for forming the gate insulating film. In this case, the metal nitride is rendered less likely to reduce the gate insulating film. To be more specific, where the gate insulating film is formed of $HfO_2$, it is desirable to use HfN, ZrN, TiN, TaN or NbN as the metal nitride. On the other hand, where the gate insulating film is formed of $Ta_2O_5$, it is desirable to use TaN or NbN as the metal nitride.

Figure 9A:
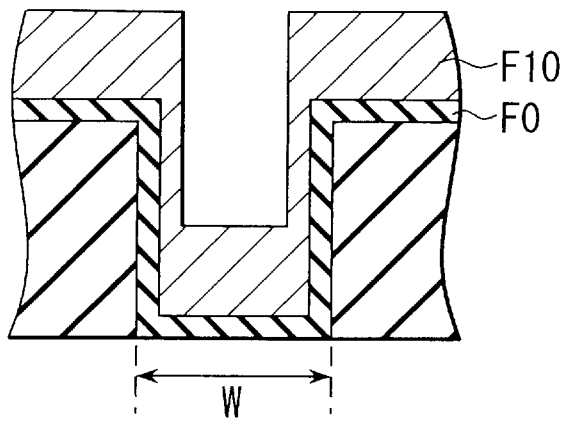
FIGS. 9A and 9B schematically show modifications in the main portion of the semiconductor device according to the first embodiment of the present invention.
Figure 9B:
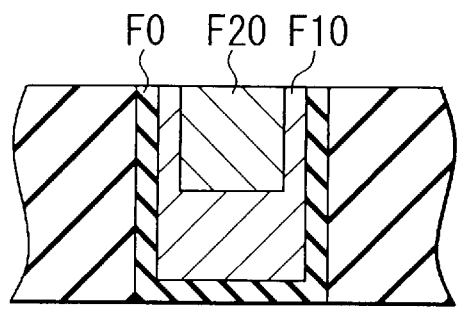

In this embodiment of the present invention, where a plurality of metal-containing films are laminated on the gate insulating film F0, it is possible to form anisotropic the lower side metal-containing film F10, as shown in FIGS. 9A and 9B. If the lower side metal-containing film F10 is formed isotropic within the groove having the gate insulating film F0 formed therein, the groove is filled completely with the lower side metal-containing film F10 in the case where the aspect ratio of the groove is increased to diminish the width W of the groove with progress in the miniaturization of the semiconductor device. As a result, the upper side metal-containing film F20 is not buried in the groove. In order to avoid this difficulty, the lower side metal-containing film F10 should be formed anisotropic such that the deposition rate in the vertical direction is made higher than the deposition rate in the horizontal direction. For depositing the metal-containing film F10 anisotropic, it is possible to use, for example, a long throw sputtering method.

Further, it is possible to use a carbon film in place of the first, second or third metal-containing film as a barrier metal for the P-type MIS transistor. Carbon has a work function of about 5 eV and, thus, can be used as an electrode for the P-type MIS transistor.

(Embodiment 2)

An example of the method for manufacturing a semiconductor device according to a second embodiment of the present invention will now be described with reference to FIGS. 10A to 10L.

Figure 10A:
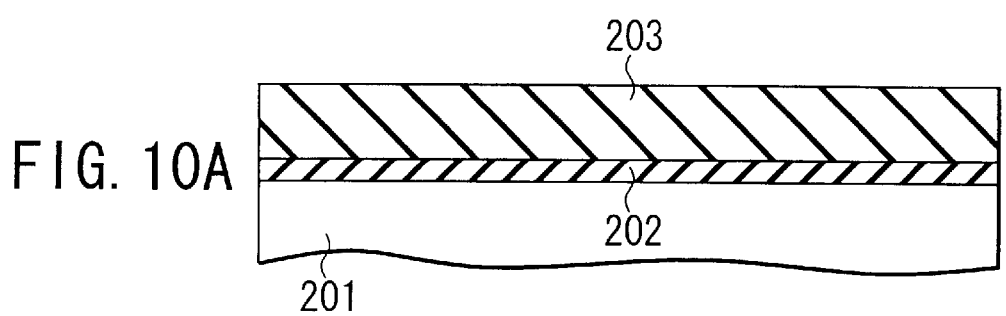
FIGS. 10A to 10L are cross sectional views collectively showing as an example a method of manufacturing a semiconductor device according to a second embodiment of the present invention.
Figure 10B:
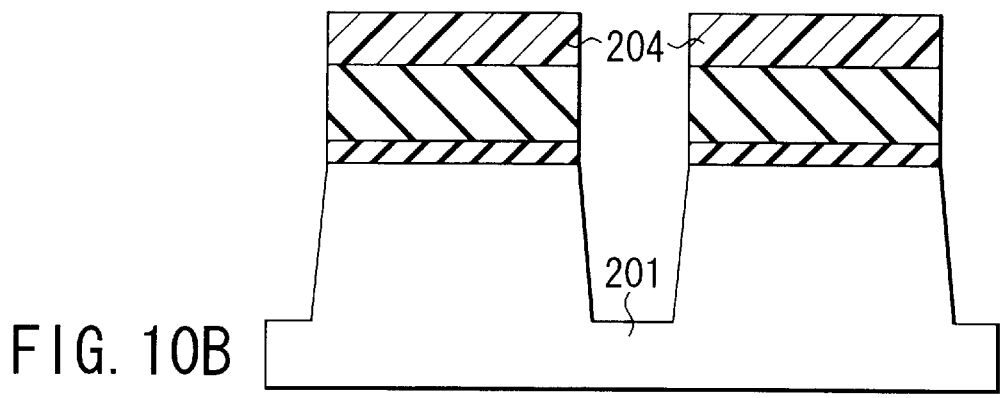

In the first step, a silicon oxide film 202 is formed by thermally oxidizing the surface of a silicon substrate 201, followed by forming a silicon nitride film 203 on the silicon oxide film 202 by a CVD method, as shown in FIG. 10A. In the next step, a pattern of a photoresist 204 is formed on the silicon nitride film 203, followed by removing the silicon nitride film 203, the silicon oxide film 202 and the silicon substrate 201 by an anisotropic etching using the pattern of the photoresist 204 as a mask so as to form an element isolating groove, as shown in FIG. 10B.

Figure 10C:
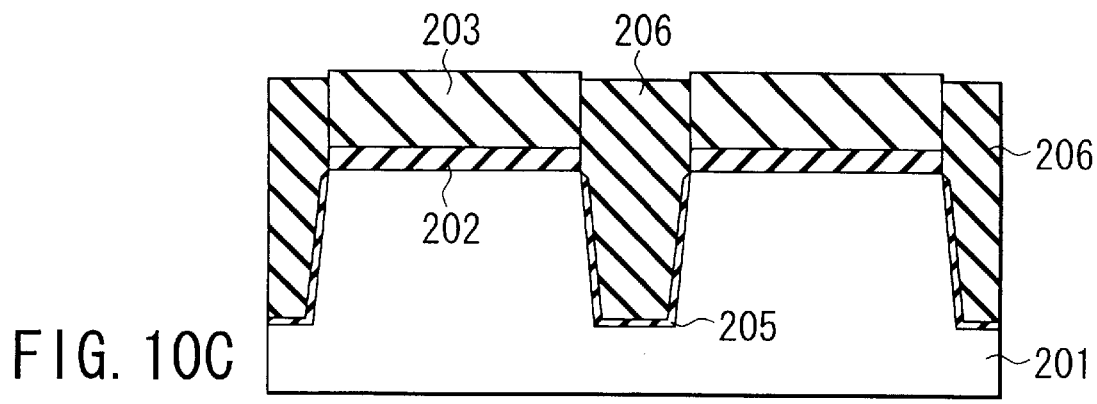

In the next step, the photoresist 204 is removed by ashing, followed by forming a silicon oxide film 205 by thermally oxidizing the exposed surface of the element separating groove at, for example, 950° C. under a $HCl/O_2$ atmosphere. Then, a silicon oxide film 206 is deposited on the entire surface by a CVD method so as to fill the element separating groove. Further, the silicon oxide film 206 is polished by a CMP method until the surface of the silicon nitride film 203 is exposed to the surface, as shown in FIG. 10C.

Figure 10D:
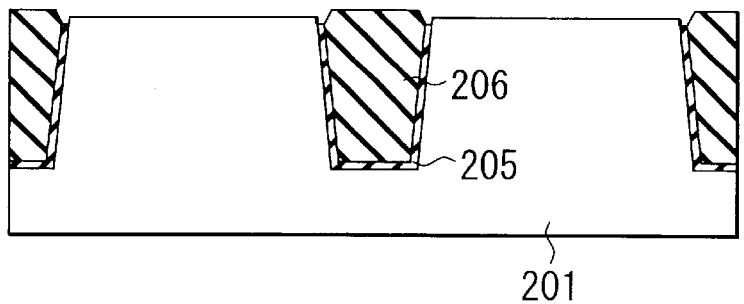

Further, the silicon nitride film 203 is selectively removed by using a hot phosphoric acid, followed by removing the silicon oxide film 202 by using a dilute hydrofluoric acid solution. In this step, the silicon oxide film 206 and the silicon oxide film 205 in an upper portion of the element separating groove are etched to some extent so as to expose the surface of the silicon substrate 201 in the vicinity of the upper edge of the element separating groove, as shown in FIG. 10D.

Figure 10E:
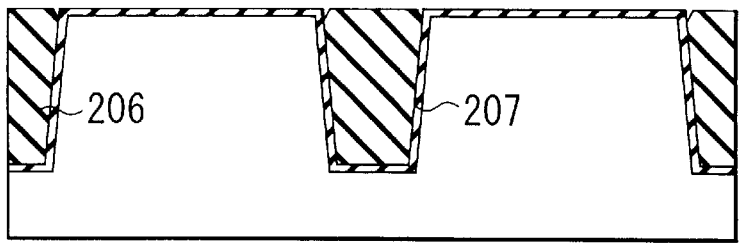
Figure 10F:
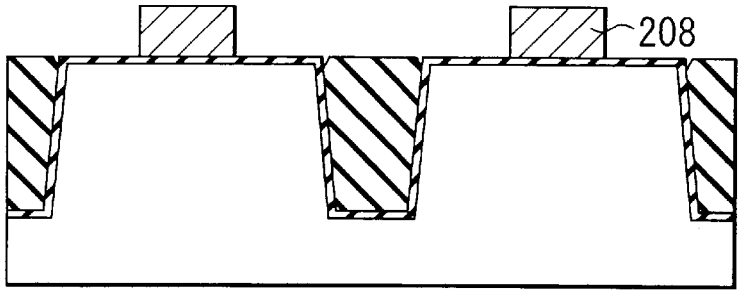

In the next step, a silicon oxide film 207 forming a dummy insulating film is formed by thermal oxidation at, for example, 900° C. under a $HCl/O_2$ atmosphere. Since the dummy insulating film 207 is formed not only on the MIS transistor forming regions but also on the upper edge of the element separating groove, the silicon substrate ceases to be exposed to the outside, as shown in FIG. 10E. Then, a polysilicon film 208 is formed on the entire surface, followed by patterning the polysilicon film 208 to form a dummy gate, as shown in FIG. 10F.

Figure 10G:
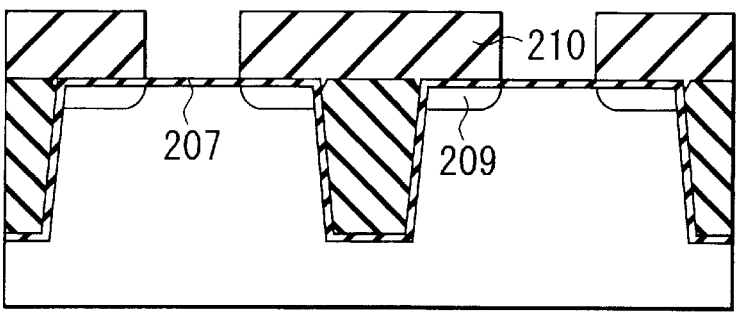

In the next step, impurity ions are implanted into the surface region of the silicon substrate 201 using as a mask the dummy gate consisting of the polysilicon film 208. Then, an annealing treatment is performed at a high temperature so as to form source-drain regions 209 in self-alignment with the dummy gate, followed by depositing an interlayer insulating film 210 on the entire surface. The interlayer insulating film 210 thus formed is flattened by a CMP method until the polysilicon film 208 is exposed to the outside. Further, the exposed polysilicon film 208 is removed by a down-flow technology using, for example, a $CF_4/O_2$ gas, as shown in FIG. 10G.

Figure 10H:
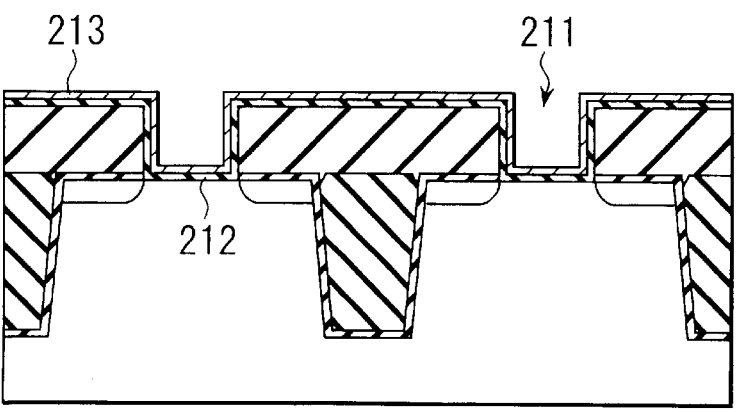

In the next step, N-type and P-type impurity ions are implanted into the silicon substrate 201 through the exposed dummy insulating film 207 in order to adjust the threshold voltages of the N-type and P-type MIS transistors, respectively. After the ion implantation step, the dummy insulating film 207 is removed by using a dilute hydrofluoric acid so as to form a groove (concave portion) 211 to which the surface of the silicon substrate 201 is exposed. Then, a $Ta_2O_5$ film 212 is formed as a gate insulating film, followed by forming a film 213 of ruthenium (Ru) or palladium (Pd) in a thickness of about 10 nm as a gate electrode material of the P-type MIS transistor, as shown in FIG. 10H.

Figure 10I:
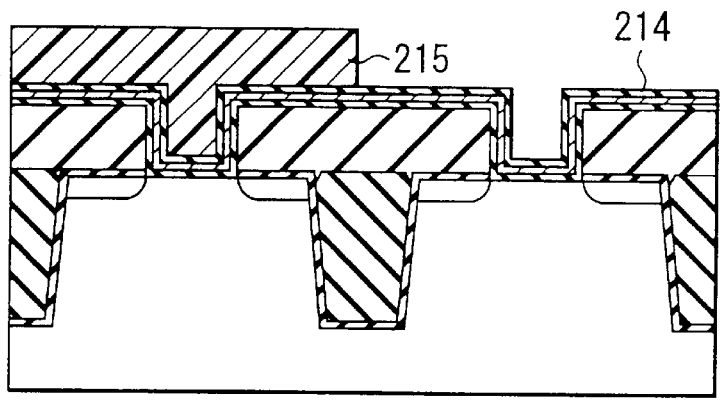

Then, a silicon nitride film 214 is formed in a thickness of 10 nm on the entire surface by a plasma CVD method. The silicon nitride film 214 is used for preventing indium (In) or tin (Sn) forming an indium or tin layer that is to be formed in the subsequent step from being diffused. Further, a pattern of a photoresist layer 215 is formed on the P-type MIS transistor forming region as shown in FIG. 10I.

Figure 10J:
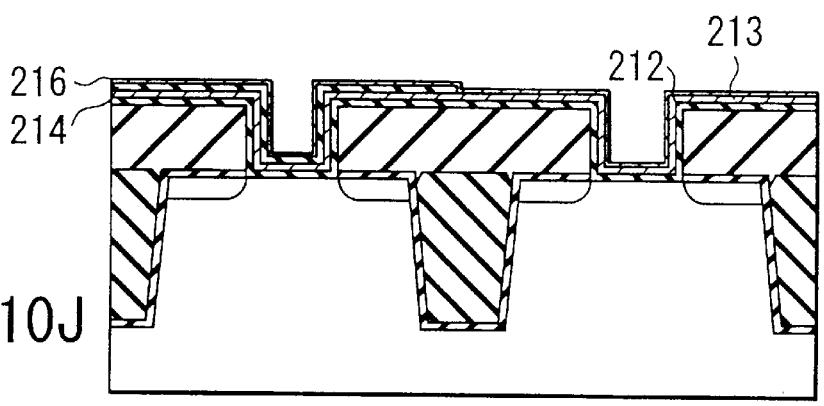

In the next step, the silicon nitride film 214 in the exposed N-type MIS transistor forming region is removed by a down-flow technology. After the pattern of the photoresist layer 215 is removed by an ashing treatment, an indium film (or a tin film) 216 is formed on the entire surface in a thickness of 1 to 2 nm as a gate electrode material of the N-type MIS transistor, as shown in FIG. 10J.

Figure 10K:
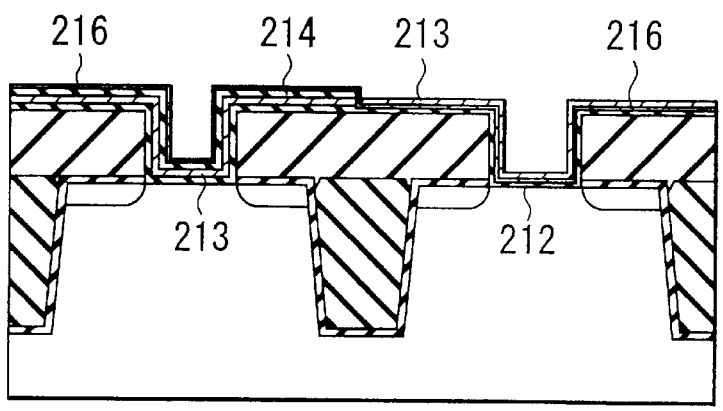

Further, an annealing treatment is performed at about 200° C. to 400° C. By this annealing treatment, indium or tin is selectively diffused only in the N-type MIS transistor forming region because the silicon nitride film 214 is formed in the P-type MIS transistor forming region. Indium or tin is diffused through the grain boundaries of the ruthenium film (or palladium film) 213. As a result, indium or tin is precipitated at the interface between the $Ta_2O_5$ film 212 forming the gate insulating film and the ruthenium film (or palladium film) 213. As a result, obtained is an indium film (or tin film) 216 forming the gate electrode of the N-type MIS transistor, as shown in FIG. 10K.

Figure 10L:
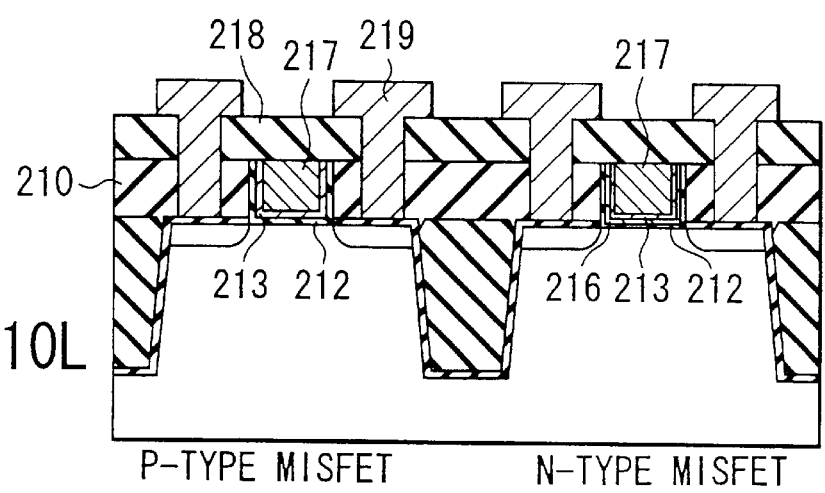

In the next step, the indium film (or tin film) 216 positioned on the P-type MIS transistor region is selectively removed, followed by removing the silicon nitride film 214 by using a down-flow technology. Then, a tungsten film 217 is buried in the grooves of the gate regions of the N-type and P-type MIS transistors. Further, the ruthenium film (or palladium film) 213, the indium film (or tin film) 216, the $Ta_2O_5$ film 212 and the tungsten film 217, which are positioned outside the grooves, are removed by a CMP method so as to leave the tungsten film 217 only within the grooves. As a result, a gate electrode including the ruthenium film (or palladium film) 213 as the lowermost layer is formed in the P-type MIS transistor. Also, a gate electrode including the indium film (or tin film) 216 as the lowermost layer is formed in the N-type MIS transistor. In the subsequent steps, an interlayer insulating film 218, a wiring 219, etc. are formed so as to finish forming a semiconductor integrated circuit, as shown in FIG. 10L.

In the example described above, a metal M2 constituting the gate electrode of the N-type MIS transistor (i.e., indium or tin in the example described above), is precipitated on the surface of the gate insulating film of the N-type MIS transistor by allowing the metal M2 to be diffused though a metal M1 constituting the gate electrode of the P-type MIS transistor (i.e., ruthenium or palladium in the example described above). Alternatively, it is also possible to permit the metal M2 to be diffused through the metal M1 so as to form an alloy consisting of the metals M1 and M2. In this case, the gate electrode of the N-type MIS transistor is formed of the alloy noted above, which is called modification 1.

In the example described above, the silicon nitride film 214 is used as a diffusion mask in diffusing the metal M2 constituting the gate electrode of the N-type MIS transistor through the metal M1 constituting the gate electrode of the P-type MIS transistor so as to permit the metal M2 to be diffused into the N-type MIS transistor region. Alternatively, it is possible to form the metal M2 on only the metal M1 in the N-type MIS transistor region without forming the silicon nitride film 21 so as to permit the metal M2 into the metal M1 in only the N-type MIS transistor region, which is called modification 2.

Further, in each of the basic structure, modification 1 and modification 2, the metal M2 is precipitated at the interface of the gate insulating film, or an alloy consisting of the metals M1 and M2 is formed in forming the gate electrode of the N-type MIS transistor. A similar method can be employed for forming the gate electrode of the P-type MIS transistor. It is also possible to apply the particular method for forming the gate electrode of each of the N-type and P-type MIS transistors.

The example described will now be explained with reference to FIGS. 11A to 11H. Incidentally, since the steps up to the step shown in FIG. 10G are equal to those described previously with reference to FIGS. 10A to 10G, the subsequent steps alone will be described in the following.

Figure 11A:
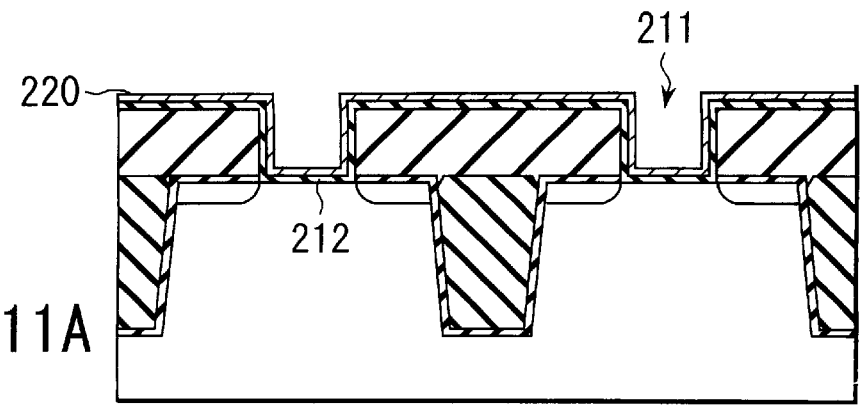
FIGS. 11A to 11H are cross sectional views collectively showing as another example a method of manufacturing a semiconductor device according to a second embodiment of the present invention.

After the step shown in FIG. 10G, N-type and P-type impurities are introduced through the exposed dummy insulating film 207 into the silicon substrate 201 by means of the ion implantation so as to adjust the threshold voltages of the N-type and P-type MIS transistors. Then, the dummy insulating film 207 is removed by using a dilute hydrofluoric acid so as to form a groove (concave portion) 211 to which the surface of the silicon substrate 201 is exposed, followed by forming the $Ta_2O_5$ film as a gate insulating film. Further, a tungsten (W) film 220 is formed in a thickness of about 10 nm, as shown in FIG. 11A.

Figure 11B:
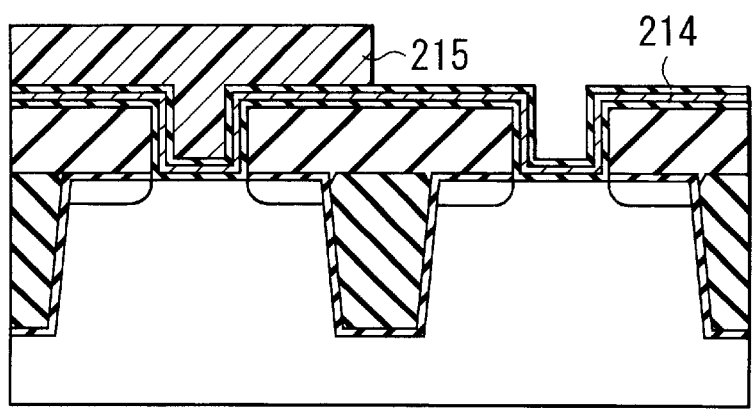

In the next step, the silicon nitride film 214 is formed on the entire surface in a thickness of 10 nm by a plasma CVD method. The silicon nitride film 214 thus formed is used as a diffusion preventing film for preventing diffusion of indium (In) or tin (Sn) forming the indium film or tin film formed in the subsequent step. Then, a pattern of the photoresist film 215 is formed on the P-type MIS transistor region, as shown in FIG. 11B.

Figure 11C:
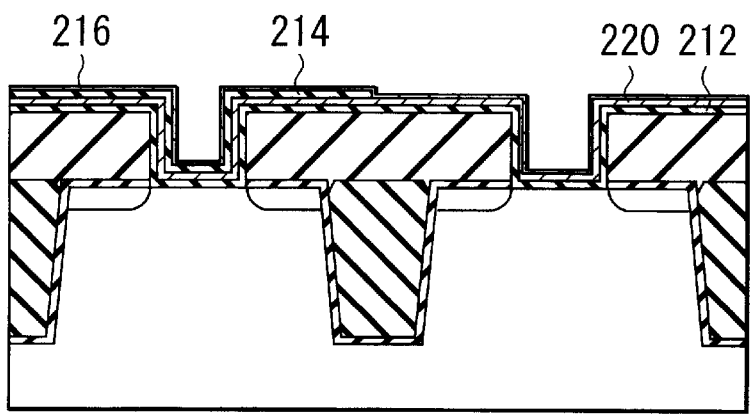

After formation of the photoresist pattern, the silicon nitride film 214 in the exposed N-type MIS transistor region is removed by a down-flow technology. After the photoresist layer 215 is removed by an ashing treatment, an indium film (or tin film) 216 is formed on the entire surface as a gate electrode material of the N-type MIS transistor in a thickness of 1 to 2 nm, as shown in FIG. 11C.

Figure 11D:
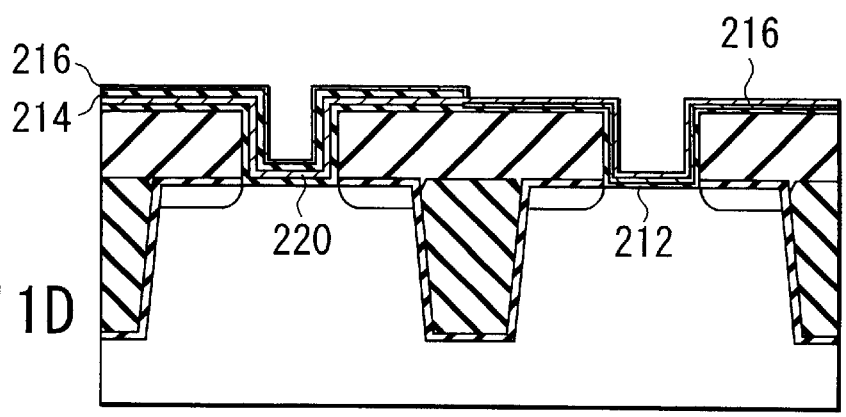

In the next step, an annealing treatment is performed at about 200° C. to 400° C. Since the silicon nitride film 214 is formed in the P-type MIS transistor region, indium or tin is selectively diffused by the annealing treatment in only the N-type MIS transistor region. The indium or tin is diffused through the crystal grain boundaries of the tungsten film 220, with the result that the indium or tin is precipitated at the interface between the $Ta_2O_5$ film 212 forming the gate insulating film and the tungsten film 220. As a result, obtained is an indium film (or tin film) 216 used as the gate electrode of the N-type MIS transistor, as shown in FIG. 11D.

Figure 11E:
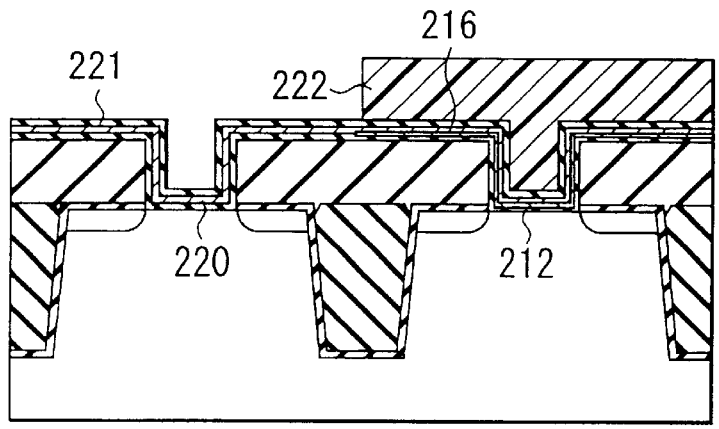

In the next step, the indium film (or tin film) 216 on the P-type MIS transistor region is selectively removed, followed by removing the silicon nitride film 214 by using a down-flow technology. Then, a silicon nitride film 221 is formed on the entire surface in a thickness of 10 nm by a plasma CVD method. The silicon nitride film 221 thus formed is used for preventing ruthenium (Ru) or palladium (Pd) constituting a ruthenium layer or a palladium layer that is to be formed in the subsequent step from being diffused. Then, a pattern of a photoresist layer 222 is formed on the N-type MIS transistor region, as shown in FIG. 11E.

Figure 11F:
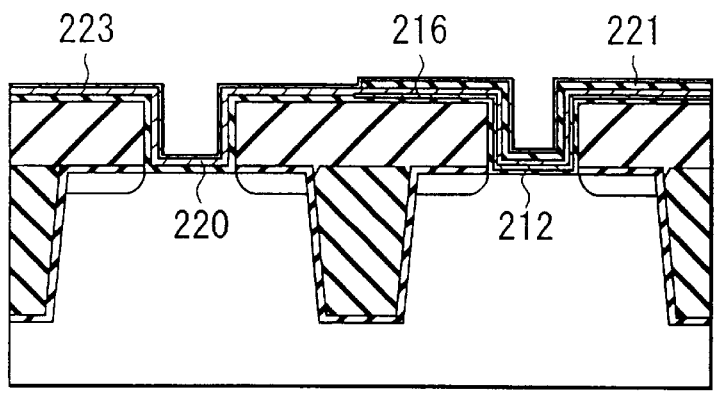

Then, the silicon nitride film 221 in the exposed P-type MIS transistor region is removed by using a down-flow technology. After the photoresist layer 222 is removed by an ashing treatment, a ruthenium film (or palladium film) 223 is formed on the entire surface in a thickness of 1 to 2 nm as a gate electrode material of the P-type MIS transistor, as shown in FIG. 11F.

Figure 11G:
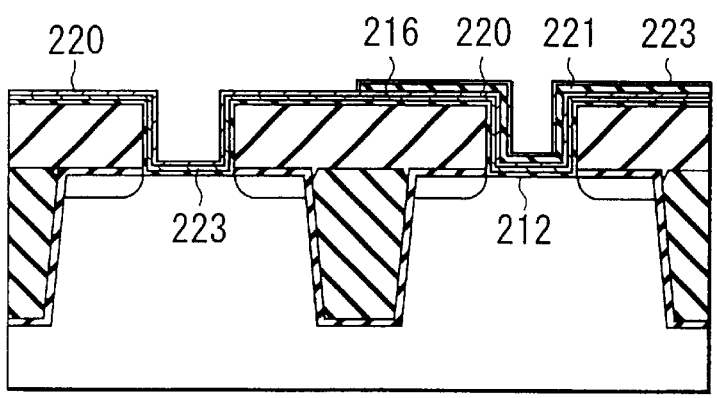

In the next step, an annealing treatment is carried out at about 200° C. to 400° C. Since the silicon nitride film 221 is formed in the N-type MIS transistor region, ruthenium or palladium is selectively diffused in only the P-type MIS transistor region. Ruthenium or palladium is diffused through the crystal grain boundaries of the tungsten film 220. As a result, ruthenium or palladium is precipitated at the interface between the $Ta_2O_5$ film 212 forming the gate insulating film and the tungsten film 220, thereby obtaining a ruthenium film (or palladium film) 223 forming the gate electrode of the P-type MIS transistor, as shown in FIG. 11G.

Figure 11H:
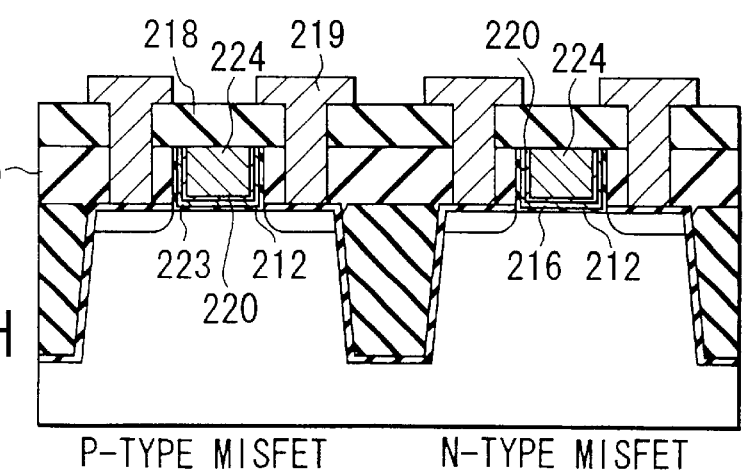

In the next step, the ruthenium film (or palladium film) 223 on the N-type MIS transistor region is selectively removed, followed by removing the silicon nitride film 221 by using a down-flow technology. Then, the tungsten film 224 is buried in the grooves of the gate electrode regions of the N-type and P-type MIS transistors. Further, the indium film (or tin film) 216, the ruthenium film (or palladium film) 223, the $Ta_2O_5$ film 212 and the tungsten films 220 and 224, which are positioned outside the grooves, are removed by a CMP method so as to leave the tungsten film 224 only within the grooves. As a result, a gate electrode having the ruthenium film (or palladium film) 223 formed to constitute the lowermost layer is formed in the P-type MIS transistor. On the other hand, a gate electrode having the indium film (or tin film) 216 formed to constitute the lowermost layer is formed in the N-type MIS transistor. In the subsequent steps, the interlayer insulating film 218 and the wiring 219 are formed so as to finish preparation of a semiconductor integrated circuit, as shown in FIG. 11H.

In the embodiment described above, the work function of that portion of the N-type MIS transistor which is in contact with the gate insulating film can be made smaller than the work function of that portion of the P-type MIS transistor which is in contact with the gate insulating film. As a result, the work function of the gate electrode for each of the N-type and P-type MIS transistors can be made optimum. It follows that it is possible to make optimum the threshold voltages of these two transistors. It should also be noted that, in this embodiment, since the metal film formed within each of the grooves for forming the gate electrodes is not removed by etching, it is possible to suppress deterioration in the reliability of the gate insulating film.

(Embodiment 3)

An example of manufacturing a semiconductor device according to a third embodiment of the present invention will now be described with reference to FIGS. 12A to 12H.

Figure 12A:
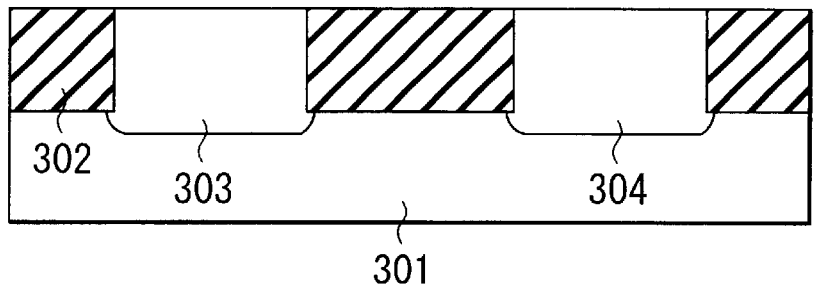
FIGS. 12A to 12H are cross sectional views collectively showing as an example a method of manufacturing a semiconductor device according to a third embodiment of the present invention.

In the first step, an element isolation region 302 is formed on a silicon substrate 301, followed by forming a P-type well diffusion layer 303 in an N-type MIS transistor region and an N-type well diffusion region 304 in a P-type MIS transistor region, as shown in FIG. 12A.

Figure 12B:
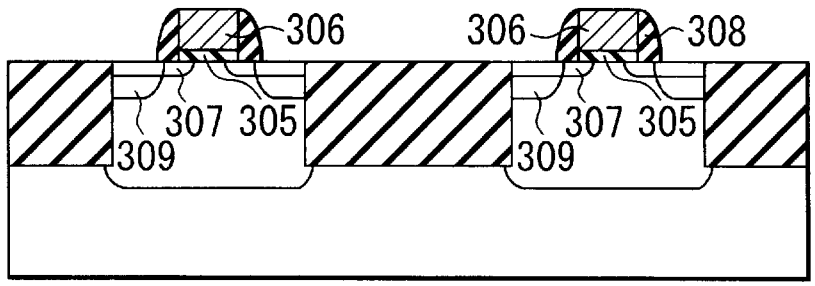

In the next step, a silicon oxide film 305 acting as a dummy insulating film is formed by oxidizing the surface of the exposed silicon substrate 301 in a thickness of about 5 nm, followed by depositing a polysilicon film 306 acting as a dummy gate and subsequently patterning the polysilicon film 306 in the shape of a gate electrode. Then, arsenic is introduced into the N-type MIS transistor region and boron is introduced into the P-type MIS transistor region by means of ion implantation by using the polysilicon film 306 forming the dummy gate as a mask so as to form extension regions forming source-drain regions 307. Further, a silicon nitride film 308 is deposited, followed by subjecting the silicon nitride film 308 to an anisotropic etching so as to form a side wall insulating film. Still further, arsenic is introduced into the N-type MIS transistor region and boron is introduced into the P-type MIS transistor region by means of ion implantation by using the side wall insulating film 308 and the polysilicon film 306 as a mask so as to form source-drain diffusion layers 309, as shown in FIG. 12B.

Figure 12C:
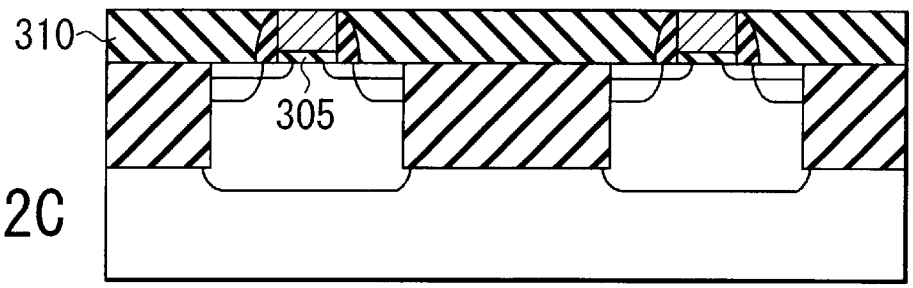
Figure 12D:
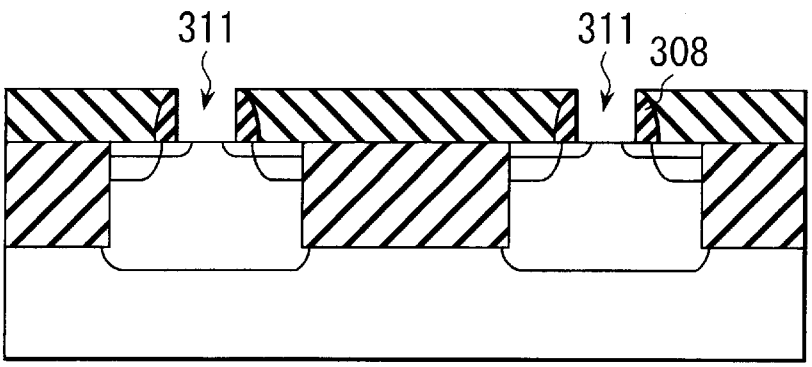

In the next step, a silicon oxide film is deposited on the entire surface as an interlayer insulating film, followed by flattening the silicon oxide film 310 by a CMP method until the polysilicon film 306 is exposed to the surface, as shown in FIG. 12C. Then, the polysilicon film 306 is removed by an isotropic etching such as a chemical dry etching. Further, the exposed silicon oxide film 305 is removed by etching with a dilute hydrofluoric acid so as to form a groove 311 for the gate electrode formation in each of the N-type and P-type MIS transistor regions, as shown in FIG. 12D.

Figure 12E:
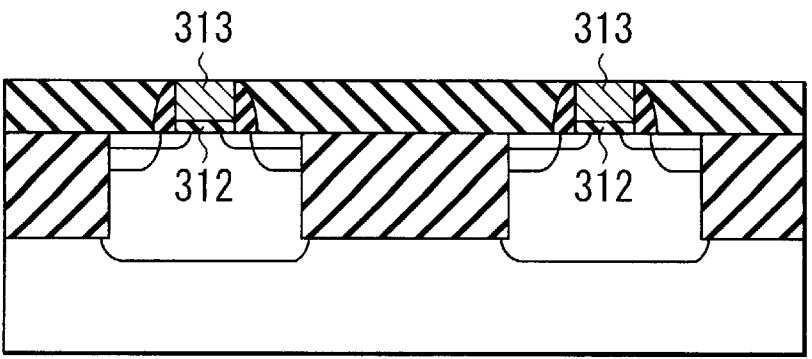

Then, the silicon substrate 301 at the bottom of the groove 311 for the gate electrode formation is thermally oxidized so as to form a gate insulating film consisting of a silicon oxide film 312. Further, a tungsten silicide ($WSi_2$) film 313 is deposited as a gate electrode material of the N-type MIS transistor on the entire surface by a CVD method, followed by removing by a CMP method that portion of the tungsten silicide film 313 which is positioned outside the groove 311 for the gate electrode formation. As a result, the tungsten silicide film 313 is left unremoved only within the groove 311 for the gate electrode formation, as shown in FIG. 12E.

Figure 12F:
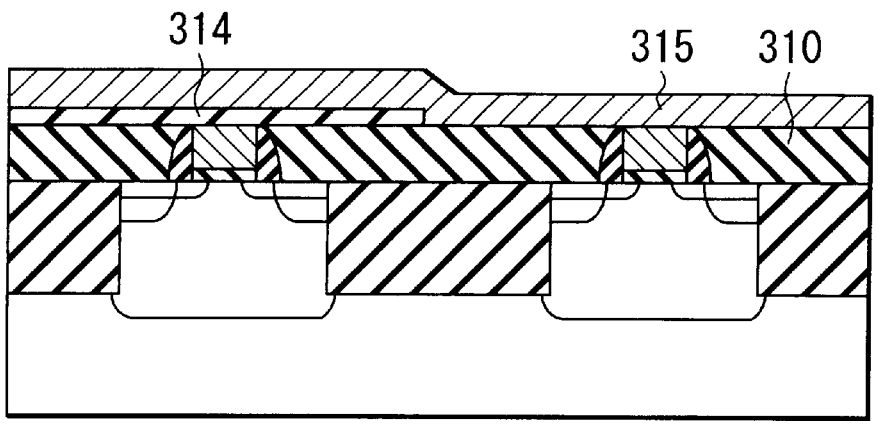

In the next step, a silicon nitride film 314 is deposited on the entire surface, followed by applying photolithography and an etching technology to the silicon nitride film 314 so as to permit the silicon nitride film 314 to be left unremoved on only the N-type MIS transistor region. Further, a palladium (Pd) film 315 is deposited on the entire surface by, for example, a sputtering method, as shown in FIG. 12F.

Figure 12G:
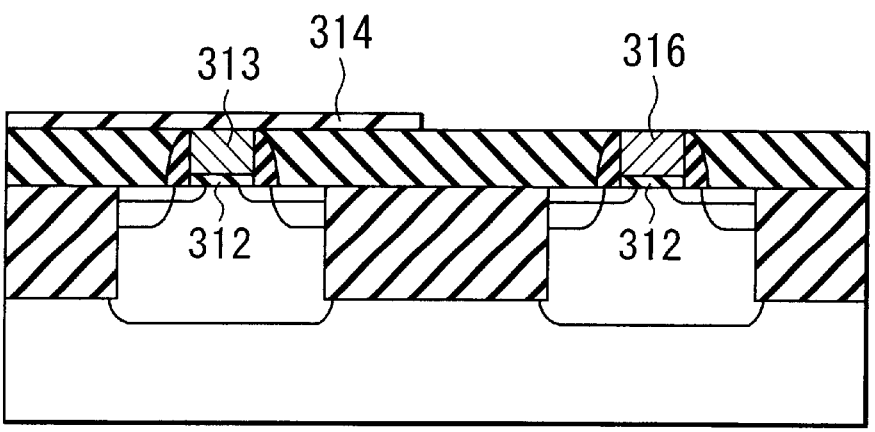

Then, an annealing treatment is carried out at 600° C. for about 1 minute. By this annealing treatment, the tungsten silicide film 313 buried in the gate electrode portion of the P-type MIS transistor reacts with the palladium film 315, with the result a palladium silicide ($Pd_2Si$) film 316 is substituted for the tungsten silicide film 313. Since the silicon nitride film 314 is formed in the N-type MIS transistor region, the palladium silicide film 316 is not substituted for the tungsten silicide film 313 in the N-type MIS transistor region. Then, the metal and the silicon nitride film 314 remaining outside the groove for the gate electrode formation is removed by, for example, a CMP method. As a result, the gate electrode of the P-type MIS transistor is formed of the palladium silicide film 316, as shown in FIG. 12G.

Figure 12H:
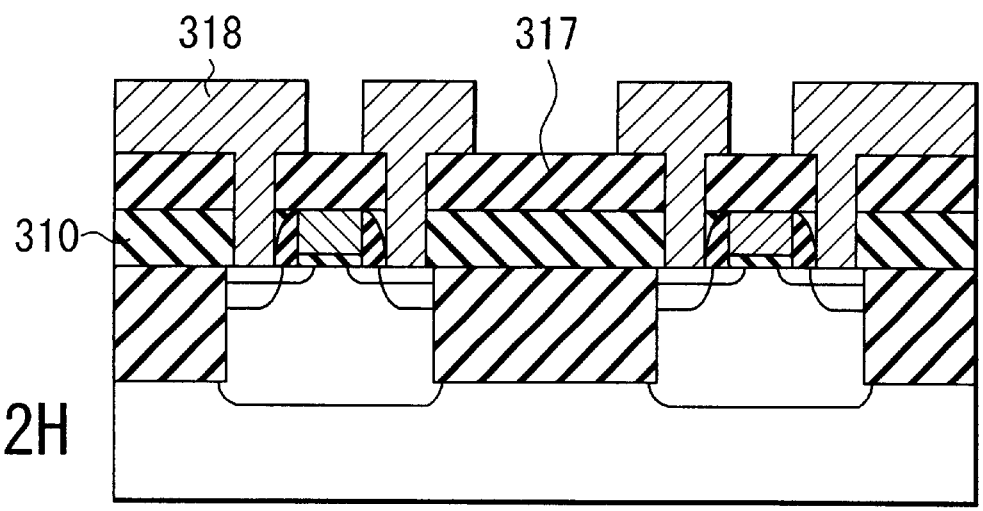

In the next step, a silicon oxide film constituting an interlayer insulating film 317 is deposited on the entire surface, followed by forming contact holes reaching the source-drain regions and the gate electrode in the interlayer insulating films 317 and 310. Then, a metal film for a wiring 318 is deposited and patterned so as to finish preparation of the N-type and P-type MIS transistors, as shown in FIG. 12H.

In the example described above, a tungsten silicide ($WSi_2$) film was used as a gate electrode material of the N-type MIS transistor. However, it is possible to use, for example, molybdenum silicide ($MoSi_2$), tantalum silicide ($TaSi_2$), niobium silicide ($NbSi_2$) or chromium silicide ($CrSi_2$) in place of tungsten silicide for forming the gate electrode of the N-type MIS transistor.

Also, in the example described above, a palladium (Pd) film was formed on the tungsten silicide film in the P-type MIS transistor region, followed by applying a heat treatment to the palladium film so as to allow palladium to react with the tungsten silicide film, thereby substituting the palladium silicide ($Pd_2Si$, PdSi) film for the tungsten silicide film. Alternatively, it is possible to use nickel (Ni) or platinum (Pt) in place of palladium so as to form a nickel silicide (NiSi, $NiSi_2$) film or a platinum silicide ($Pt_2Si$, PtSi) film.

Further, in the example described above (as well as in the second and third examples that are to be described herein later), a silicon oxide film obtained by thermal oxidation was used as the gate insulating film. Alternatively, it is possible to use a $Ta_2O_5$ film formed by, for example, a CVD method.

Figure 13A:
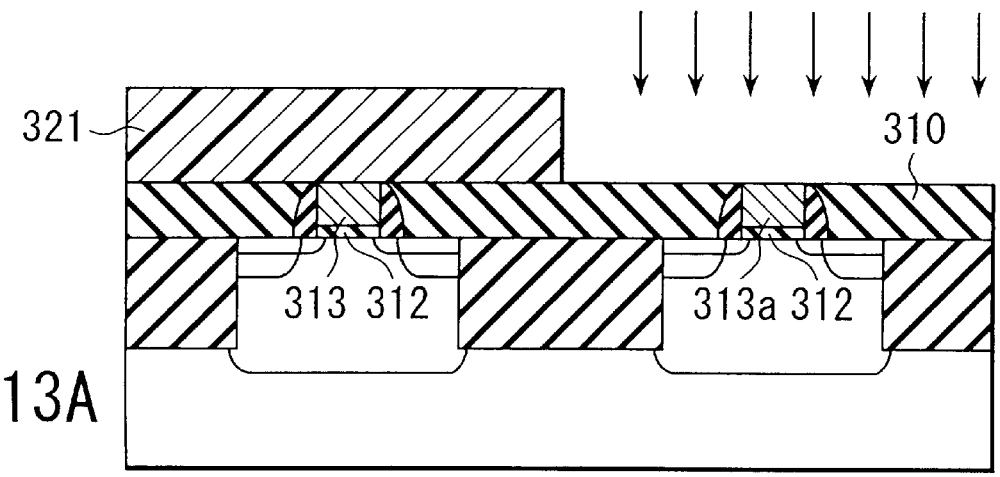
FIGS. 13A to 13C are cross sectional views collectively showing as another example a method of manufacturing a semiconductor device according to a third embodiment of the present invention.
Figure 13B:
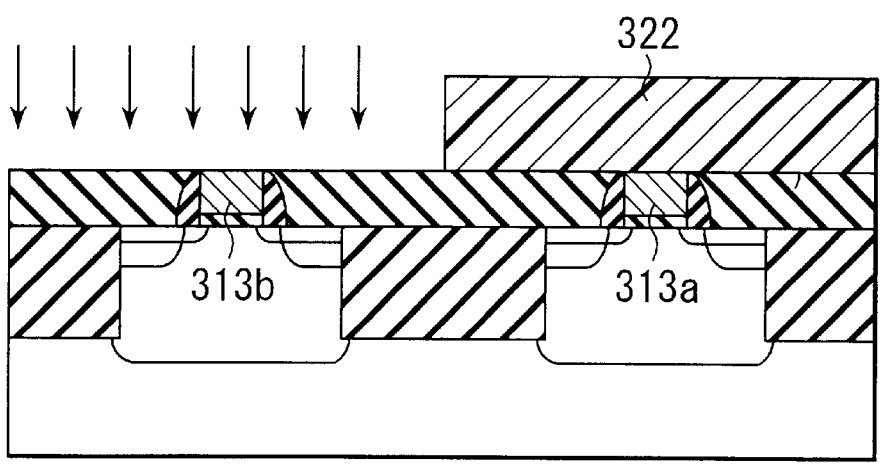
Figure 13C:
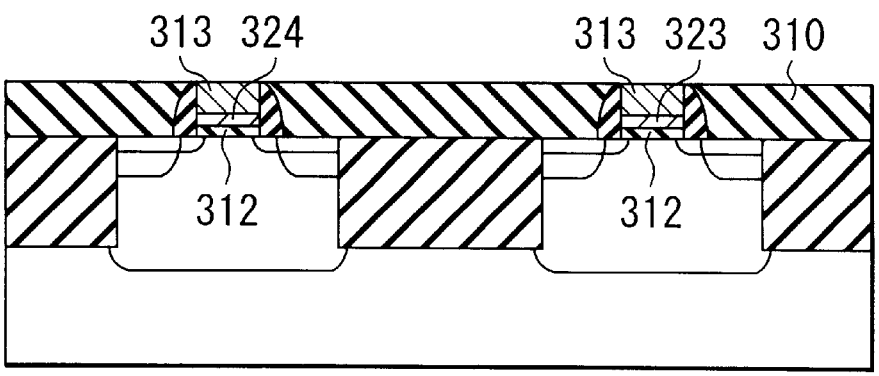

A second example of manufacturing a semiconductor device according to embodiment 3 of the present invention will now be described with reference to FIGS. 13A to 13C. Incidentally, the second example is equal to the first example in the steps shown in FIGS. 12A to 12E and, thus, the steps after the step shown in FIG. 12E will now be described in conjunction with the second example of embodiment 3.

Specifically, after the step shown in FIG. 12E, a resist layer 321 is formed in the N-type MIS transistor region. Then, germanium ions ($Ge^+$) are selectively implanted into only the tungsten silicide film 313 in the P-type MIS transistor region using the resist layer 321 as a mask so as to form a tungsten silicide film 313a containing germanium. In this step, the concentration of the germanium ions introduced into the tungsten silicide film 313 should be higher than the upper limit at which germanium forms a solid solution within the tungsten silicide film, e.g., about $1 \times 10^{17}$ $cm^{-3}$, as shown in FIG. 13A.

In the next step, a resist layer 322 is formed in the P-type MIS transistor region. Then, indium ions ($In^+$) are selectively implanted into only the tungsten silicide film 313 in the N-type MIS transistor region by using the resist layer 322 as a mask so as to form a tungsten silicide film 313b containing indium. In this step, the concentration of the indium ions introduced into the tungsten silicide film 313 should be higher than the upper limit at which indium forms a solid solution within the tungsten silicide film, e.g., about $1 \times 10^{17}$ $cm^{-3}$, as shown in FIG. 13B.

Then, a heat treatment is applied at 800° C. for about one minute so as to permit the germanium and indium implanted into the tungsten silicide film 313 to be precipitated at the interface between the tungsten silicide film 313 and the gate insulating film 312. As a result, a gate electrode of a laminate structure consisting of the germanium film 323 and the tungsten silicide film 313 is formed in the P-type MIS transistor. On the other hand, a gate electrode of a laminate structure consisting of the indium film 324 and the tungsten silicide film 313 is formed in the N-type MIS transistor, as shown in FIG. 13C.

Finally, an interlayer insulating film is deposited, followed by forming a contact hole in the interlayer insulating film thus formed and subsequently forming a wiring as in the first example so as to finish preparation of the N-type and P-type MIS transistors.

In the example described above, a tungsten silicide ($WSi_2$) film was formed in advance within the groove for the gate electrode. Alternatively, it is also possible to use molybdenum silicide ($MoSi_2$), tantalum silicide ($TaSi_2$), niobium silicide ($NbSi_2$) or chromium silicide ($CrSi_2$) in place of tungsten silicide.

Also, in the example described above, germanium (Ge) was precipitated at the interface of the gate insulating film in the P-type MIS transistor. Also, indium (In) was precipitated at the interface of the gate insulating film in the N-type MIS transistor. However, it is also possible to use different materials selected from among germanium, indium, antimony (Sb) platinum (Pt) and palladium (Pd) for the N-type and P-type MIS transistors. Further, it is possible to introduce these materials into one of the P-type and N-type MIS transistors so as to permit these materials to be precipitated in one of these MIS transistors. In this case, the original gate electrode material, i.e., tungsten silicide in the example described above, is used as it is as the gate electrode in the other MIS transistor.

Further, in the example described above, the materials introduced by ion implantation was allowed to be precipitated on the surface of the gate insulating film by the heat treatment. Alternatively, it is possible to introduce different materials into the gate electrodes of the P-type and N-type MIS transistors by ion implantation, followed by applying a heat treatment so as to permit the materials introduced by ion implantation to react with the gate electrode materials.

A third example of manufacturing a semiconductor device according to embodiment 3 of the present invention will now be described with reference to FIGS. 14A to 14C. Incidentally, the third example is equal to the first example in the steps shown in FIGS. 12A to 12D and, thus, the steps after the step shown in FIG. 12D will now be described in conjunction with the third example of embodiment 3.

Figure 14A:
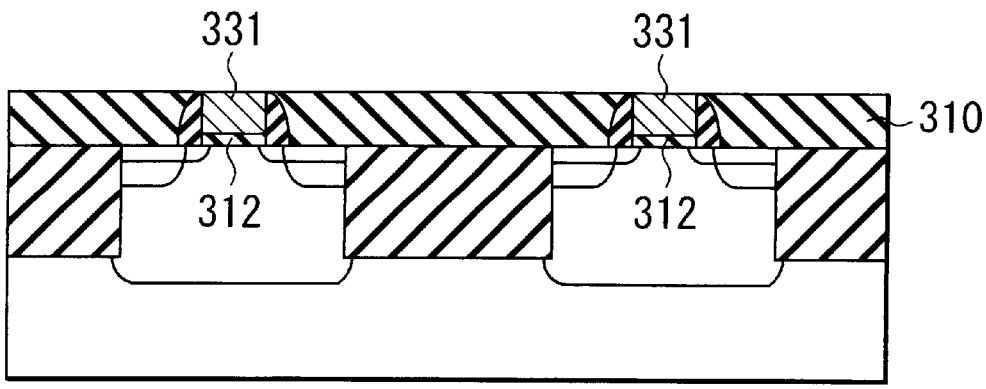
FIGS. 14A to 14C are cross sectional views collectively showing as another example a method of manufacturing a semiconductor device according to a third embodiment of the present invention.
Figure 14B:
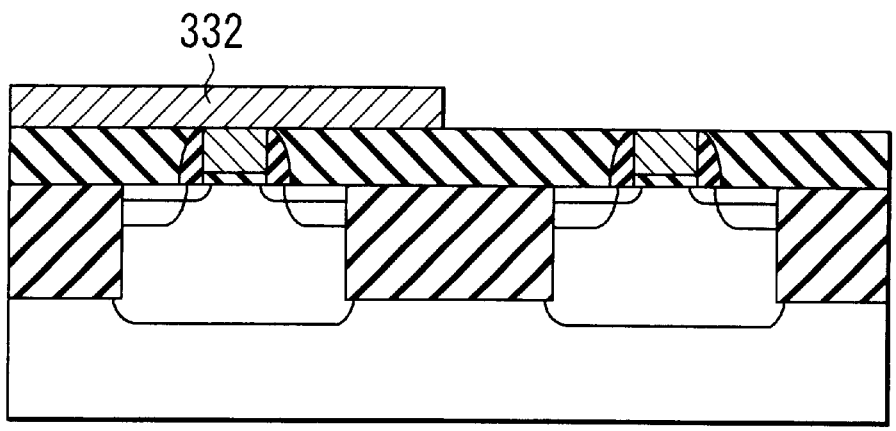
Figure 14C:
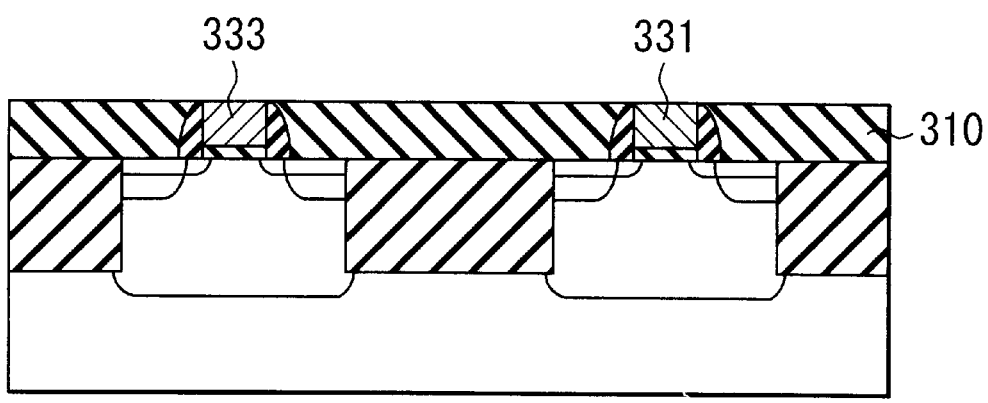
Figure 15A:
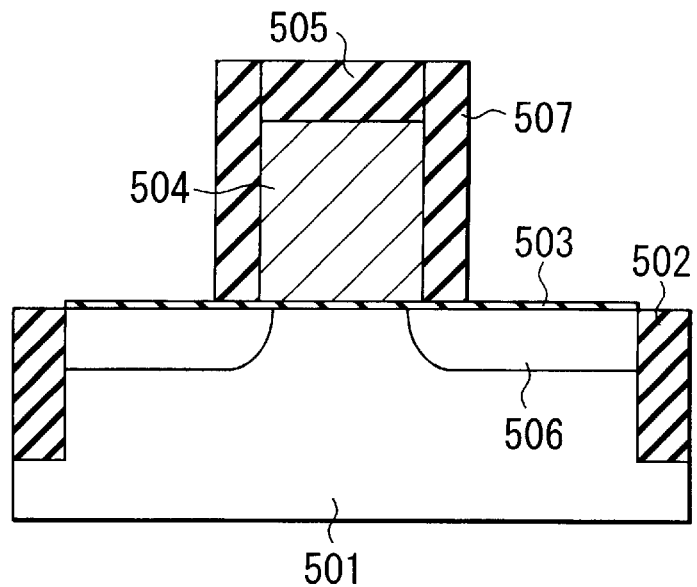
FIGS. 15A to 15J are cross sectional views showing a conventional method of manufacturing a semiconductor device.
Figure 15B:
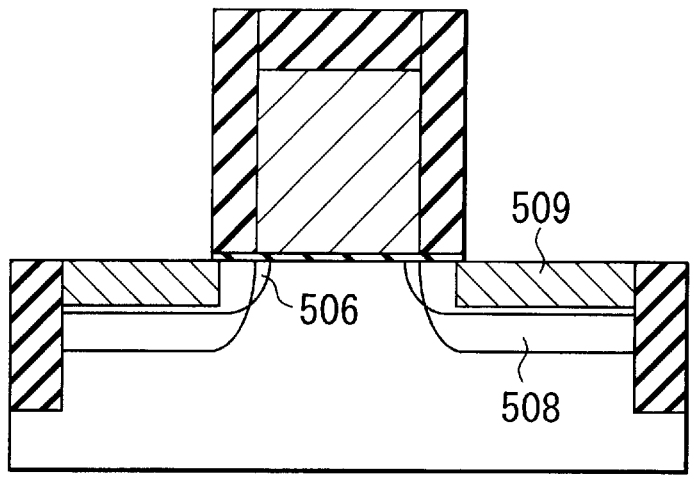
Figure 15C:
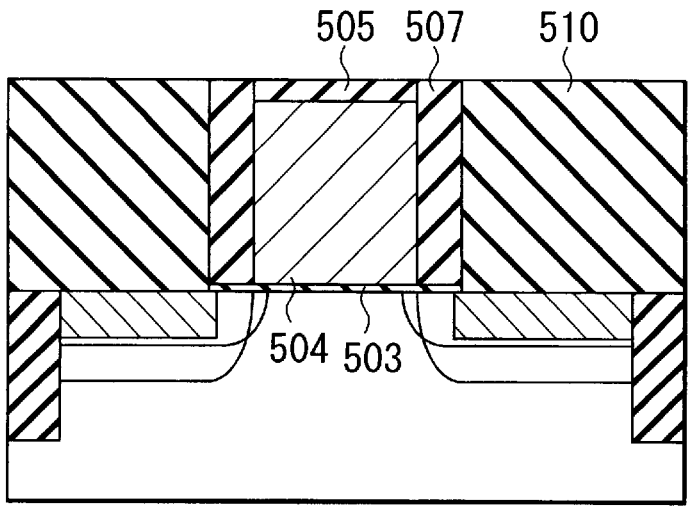
Figure 15D:
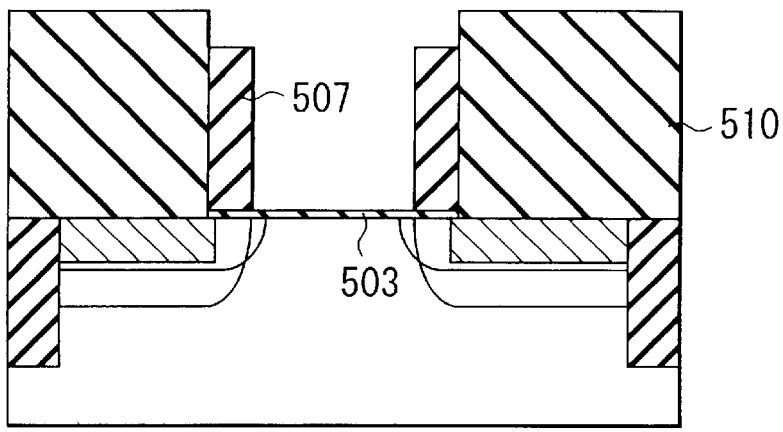
Figure 15E:
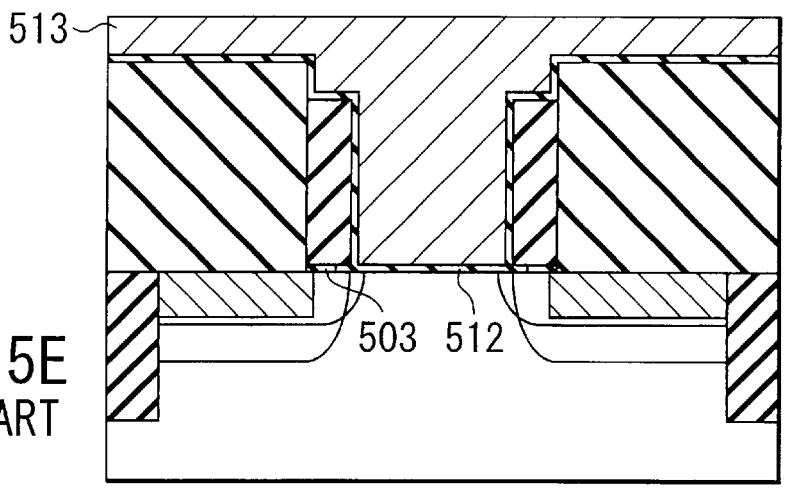
Figure 15F:
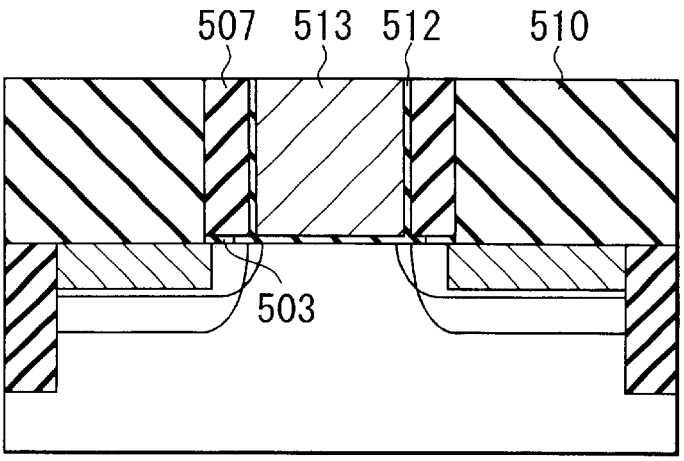
Figure 15G:
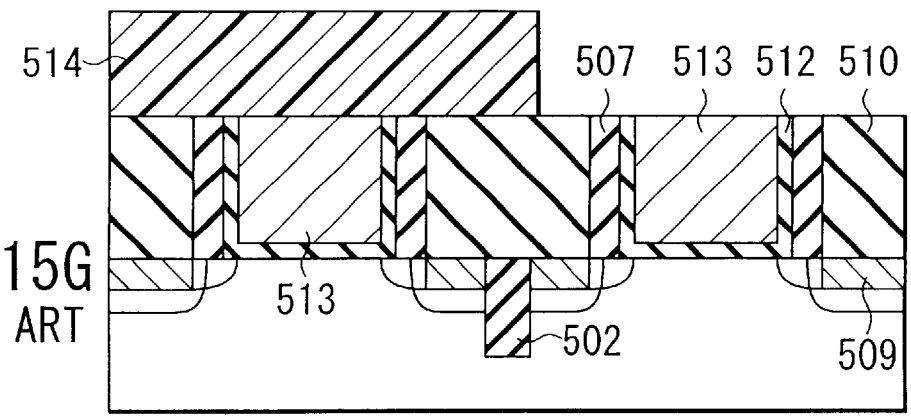
Figure 15H:
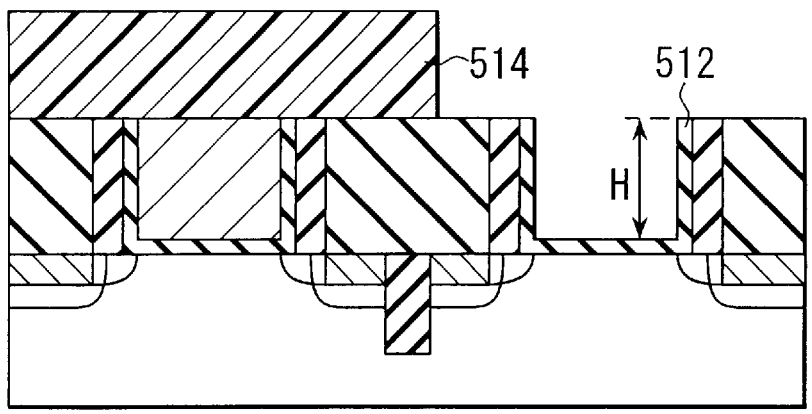
Figure 15I:
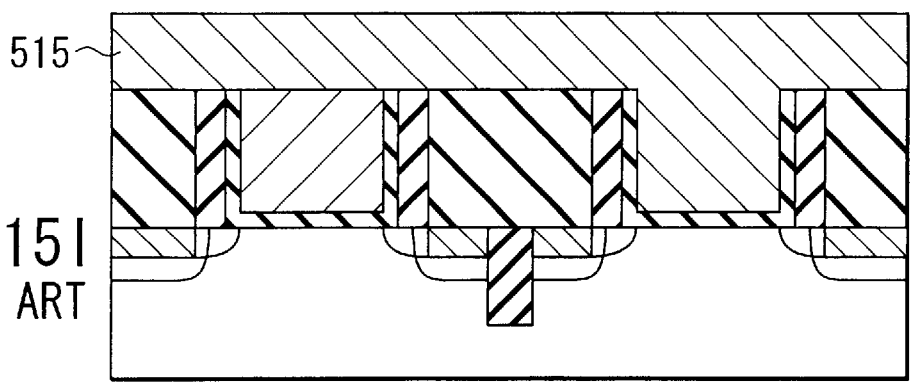
Figure 15J:
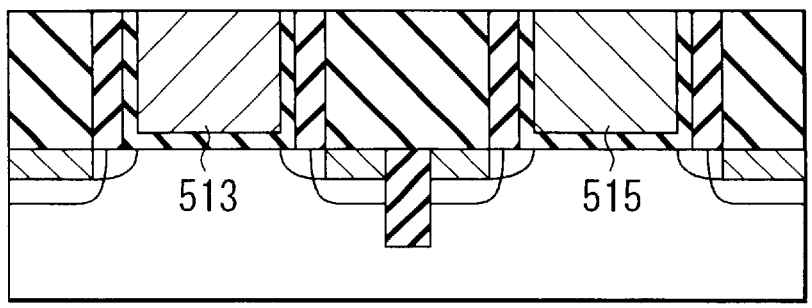
Figure 16A:
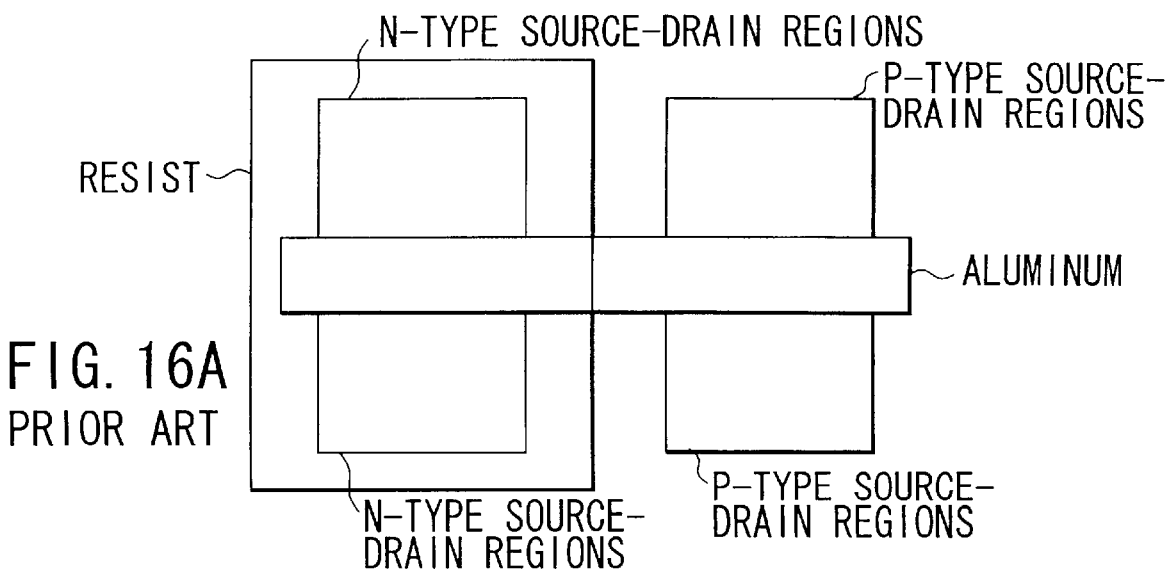
FIGS. 16A to 16C are plan views showing the problem inherent in the conventional method of manufacturing a semiconductor device.
Figure 16B:
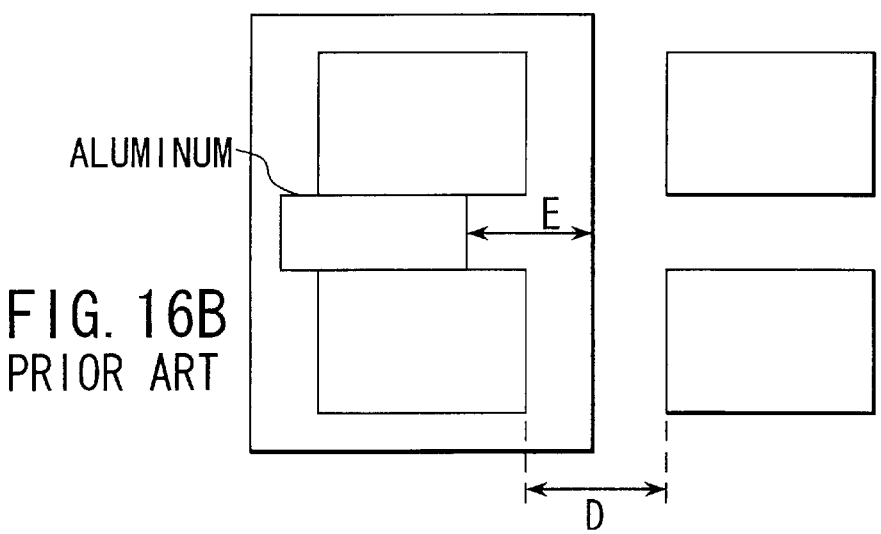
Figure 16C:
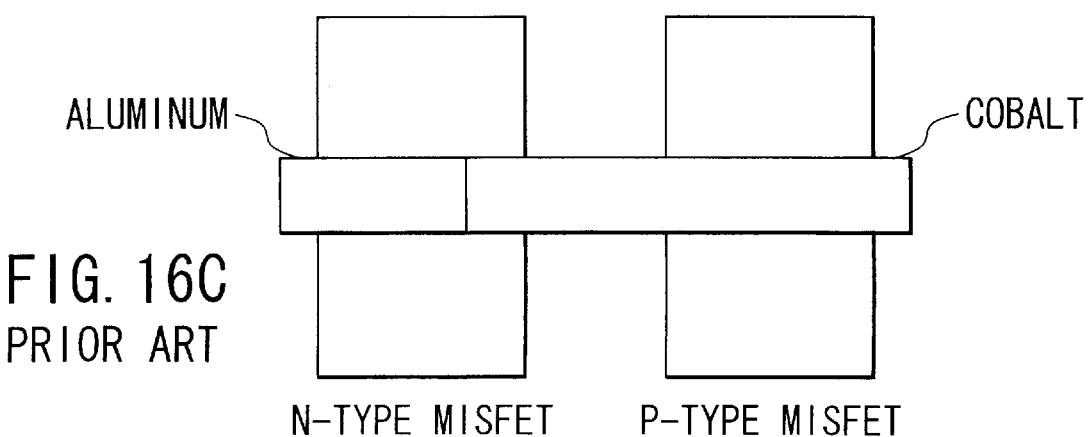

Specifically, after the step shown in FIG. 12D, a nickel (Ni) film 331 is buried in the groove for the gate electrode formation by employing a sputtering method and a CMP method, as shown in FIG. 14A. Then, an amorphous silicon (a—Si) film 332 is deposited on the entire surface by means of sputtering, followed by selectively removing the amorphous silicon film 332 in the region except the N-type MIS transistor region by employing a photolithography method and a dry etching method, as shown in FIG. 14B.

In the next step, a heat treatment is applied at 400° C. for about one minute so as to carry out the reaction between the nickel film 331 and the amorphous silicon film 332 in the N-type MIS transistor region, thereby forming a nickel silicide (NiSi) film 333. Then, the unreacted amorphous silicon film 332 is removed by a chemical dry etching, as shown in FIG. 14C. By converting the nickel film 331 into the nickel silicide film 333 as described above, the work function can be lowered from about 5.0 eV to about 4.36 eV.

Finally, an interlayer insulating film is deposited, followed by forming a contact hole in the interlayer insulating film thus formed and subsequently forming a wiring as in the first example so as to finish preparation of the N-type and P-type MIS transistors.

In the example described above, the gate electrode of the P-type MIS transistor is formed of nickel (Ni). Also, the gate electrode of the N-type MIS transistor is formed of nickel silicide (NiSi, $NiSi_2$). Alternatively, it is possible to employ a combination of cobalt (Co) and cobalt silicide ($CoSi_2$), another combination of chromium (Cr) and chromium silicide ($CrSi_2$), or still another combination of molybdenum (Mo) and molybdenum silicide ($MoSi_2$).

According to this embodiment, the work function of that portion of the gate electrode of the N-type MIS transistor which is brought into contact with the gate insulating film is made smaller than the work function of that portion of the gate electrode of the P-type MIS transistor which is brought into contact with the gate insulating film. As a result, it is possible to make optimum the work function of the gate electrode of each of the N-type and P-type MIS transistors. Naturally, it is possible to make optimum the threshold voltage of each of these MIS transistors. What should also be noted is that, in this embodiment, the metal film formed within the groove for forming the gate electrode is not removed by etching, making it possible to suppress deterioration in the reliability of the gate insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having an N-type MIS transistor formed in a first region and a P-type MIS transistor formed in a second region, wherein, said N-type MIS transistor includes a first gate insulating film formed on at least the bottom of a first concave portion formed in the first region and a first gate electrode formed on said first gate insulating film;

said P-type MIS transistor includes a second gate insulating film formed on at least the bottom of a second concave portion formed in the second region and a second gate electrode formed on said second gate insulating film;

each of said first and second gate electrodes includes at least one metal-containing film having a metallic property, and at least one of the first and second gate electrodes is of a laminate structure including a plurality of the metal-containing films having a metallic property; and a work function of the metal-containing film having a metallic property constituting at least a part of said first gate electrode and in contact with said first gate insulating film is smaller than a work function of the metal-containing film having a metallic property constituting at least a part of said second gate electrode and in contact with said second gate insulating film.

2. The semiconductor device according to claim 1, wherein the metal-containing film constituting at least a part of said first gate electrode is selected from the group consisting of a metal film and a metal compound film, and the metal-containing film constituting at least a part of said second gate electrode is selected from the group consisting of a metal film and a metal compound film.

3. The semiconductor device according to claim 2, wherein said metal compound film is selected from the group consisting of a metal silicide film and a metal nitride film.

4. The semiconductor device according to claim 1, wherein the metal-containing film, which is included in said laminate structure forming said first gate electrode and is in contact with said first gate insulating film, is formed along the bottom and side wall of said first concave portion.

5. The semiconductor device according to claim 1, wherein the metal-containing film, which is included in said laminate structure forming said second gate electrode and is in contact with said second gate insulating film, is formed along the bottom and side wall of said second concave portion.

6. The semiconductor device according to claim 1, wherein the metal-containing film, which is included in said laminate structure forming said first gate electrode and is in contact with said first gate insulating film, is thicker on a bottom of said first concave portion than on a side wall of the first concave portion.

7. The semiconductor device according to claim 1, wherein the metal-containing film, which is included in said laminate structure forming said second gate electrode and is in contact with said second gate insulating film, is thicker on a bottom of said second concave portion than on a side wall of the second concave portion.

8. The semiconductor device according to claim 1, wherein said first gate electrode is formed of a laminate structure consisting of a hafnium nitride film and a cobalt film, said second gate electrode is formed of a cobalt film, and each of said first and second gate insulating films is formed of a hafnium oxide film.

* * * * *